(12) United States Patent
Rozek et al.

(10) Patent No.: US 10,382,071 B2
(45) Date of Patent: Aug. 13, 2019

(54) BANDWIDTH OPTIMIZATION FOR POWER AMPLIFIER POWER SUPPLIES

(71) Applicant: RF Micro Devices, Inc., Greensboro, NC (US)

(72) Inventors: Ashraf Rozek, Greensboro, NC (US); Jason Yorks, Greensboro, NC (US)

(73) Assignee: Qorvo US, Inc., Greensboro, NC (US)

(*) Notice: Subject to any disclaimer, the term of this patent is extended or adjusted under 35 U.S.C. 154(b) by 152 days.

(21) Appl. No.: 15/094,250

(22) Filed: Apr. 8, 2016

(65) Prior Publication Data

US 2017/0214418 A1 Jul. 27, 2017

Related U.S. Application Data

(60) Provisional application No. 62/287,609, filed on Jan. 27, 2016.

(51) Int. Cl.
| | | |
|---|---|---|
| *H04B 1/04* | (2006.01) | |
| *H04L 5/14* | (2006.01) | |
| *H03F 1/02* | (2006.01) | |
| *G05F 3/02* | (2006.01) | |
| *H03F 1/00* | (2006.01) | |
| *H03F 3/193* | (2006.01) | |
| *H03G 1/04* | (2006.01) | |
| *H03H 21/00* | (2006.01) | |

(52) U.S. Cl.
CPC .......... *H04B 1/04* (2013.01); *G05F 3/02* (2013.01); *H03F 1/02* (2013.01); *H03F 1/025* (2013.01); *H03F 3/193* (2013.01); *H03G 1/04* (2013.01); *H04L 5/1461* (2013.01); *H03H 21/002* (2013.01)

(58) Field of Classification Search
CPC combination set(s) only.
See application file for complete search history.

(56) References Cited

U.S. PATENT DOCUMENTS 9,298,198 B2 3/2016 Kay et al.
2013/0214862 A1* 8/2013 Presti .................. H03F 3/24
330/151

(Continued)

OTHER PUBLICATIONS

Ghaffari, A., Klumperink, E. and Nauta, B., Feb. 2012. 8-path tunable RF notch filters for blocker suppression. In Solid-State Circuits Conference Digest of Technical Papers (ISSCC), 2012 IEEE International (pp. 76-78). IEEE.*

*Primary Examiner* — Zhitong Chen
(74) *Attorney, Agent, or Firm* — Withrow & Terranova, P.L.L.C.

(57) ABSTRACT

Circuitry, which includes a PA power supply and RF PA circuitry, is disclosed. The RF PA circuitry includes a group of RF PAs and a group of PA decoupling circuits. The group of RF PAs includes a first RF PA and a second RF PA. The group of PA decoupling circuits includes a first PA decoupling circuit and a second PA decoupling circuit. The PA power supply provides a first PA power supply output signal to at least one of the group of RF PAs and to at least one of the group of PA decoupling circuits. The first PA decoupling circuit is coupled across the first RF PA, is programmable, and at least partially decouples the first RF PA from other circuitry. The second PA decoupling circuit is coupled across the second RF PA and at least partially decouples the second RF PA from other circuitry.

20 Claims, 20 Drawing Sheets

(56) References Cited

U.S. PATENT DOCUMENTS

| | | | | |
|---|---|---|---|---|
| 2013/0238913 A1* | 9/2013 | Huang | ................ | H04W 52/028 |
| | | | | 713/310 |
| 2013/0271221 A1* | 10/2013 | Levesque | ................ | H03F 3/193 |
| | | | | 330/294 |
| 2014/0009226 A1* | 1/2014 | Severson | ................ | H03F 3/68 |
| | | | | 330/124 R |
| 2014/0028368 A1* | 1/2014 | Khlat | ................ | H03H 21/0021 |
| | | | | 327/311 |
| 2014/0118063 A1* | 5/2014 | Briffa | ................ | H03F 1/32 |
| | | | | 330/124 R |

* cited by examiner

BANDWIDTH OPTIMIZATION FOR POWER AMPLIFIER POWER SUPPLIES

RELATED APPLICATIONS

This application claims the benefit of U.S. provisional patent application No. 62/287,609, filed Jan. 27, 2016, the disclosure of which is incorporated herein by reference in its entirety.

FIELD OF THE DISCLOSURE

Embodiments of the present disclosure relate to switching power supplies and radio frequency (RF) power amplifier (PA)s, both of which may be used in RF communication systems.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, and efficient as is practical. Thus, there is a need for RF circuitry in a communications device that is low cost, small, simple, efficient, and meets performance requirements.

SUMMARY

Circuitry, which includes a PA power supply and RF PA circuitry, is disclosed according to one embodiment of the present disclosure. The RF PA circuitry includes a group of RF PAs and a group of PA decoupling circuits. The group of RF PAs includes a first RF PA and a second RF PA. The group of PA decoupling circuits includes a first PA decoupling circuit and a second PA decoupling circuit. The PA power supply provides a first PA power supply output signal to at least one of the group of RF PAs and to at least one of the group of PA decoupling circuits. The first PA decoupling circuit is coupled across the first RF PA, is programmable, and at least partially decouples the first RF PA from other circuitry. The second PA decoupling circuit is coupled across the second RF PA and at least partially decouples the second RF PA from other circuitry.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Circuitry, which includes a PA power supply and RF PA circuitry, is disclosed according to one embodiment of the present disclosure. The RF PA circuitry includes a group of RF PAs and a group of PA decoupling circuits. The group of RF PAs includes a first RF PA and a second RF PA. The group of PA decoupling circuits includes a first PA decoupling circuit and a second PA decoupling circuit. The PA power supply provides a first PA power supply output signal to at least one of the group of RF PAs and to at least one of the group of PA decoupling circuits. The first PA decoupling circuit is coupled across the first RF PA, is programmable, and at least partially decouples the first RF PA from other circuitry. The second PA decoupling circuit is coupled across the second RF PA and at least partially decouples the second RF PA from other circuitry.

Figure 1:
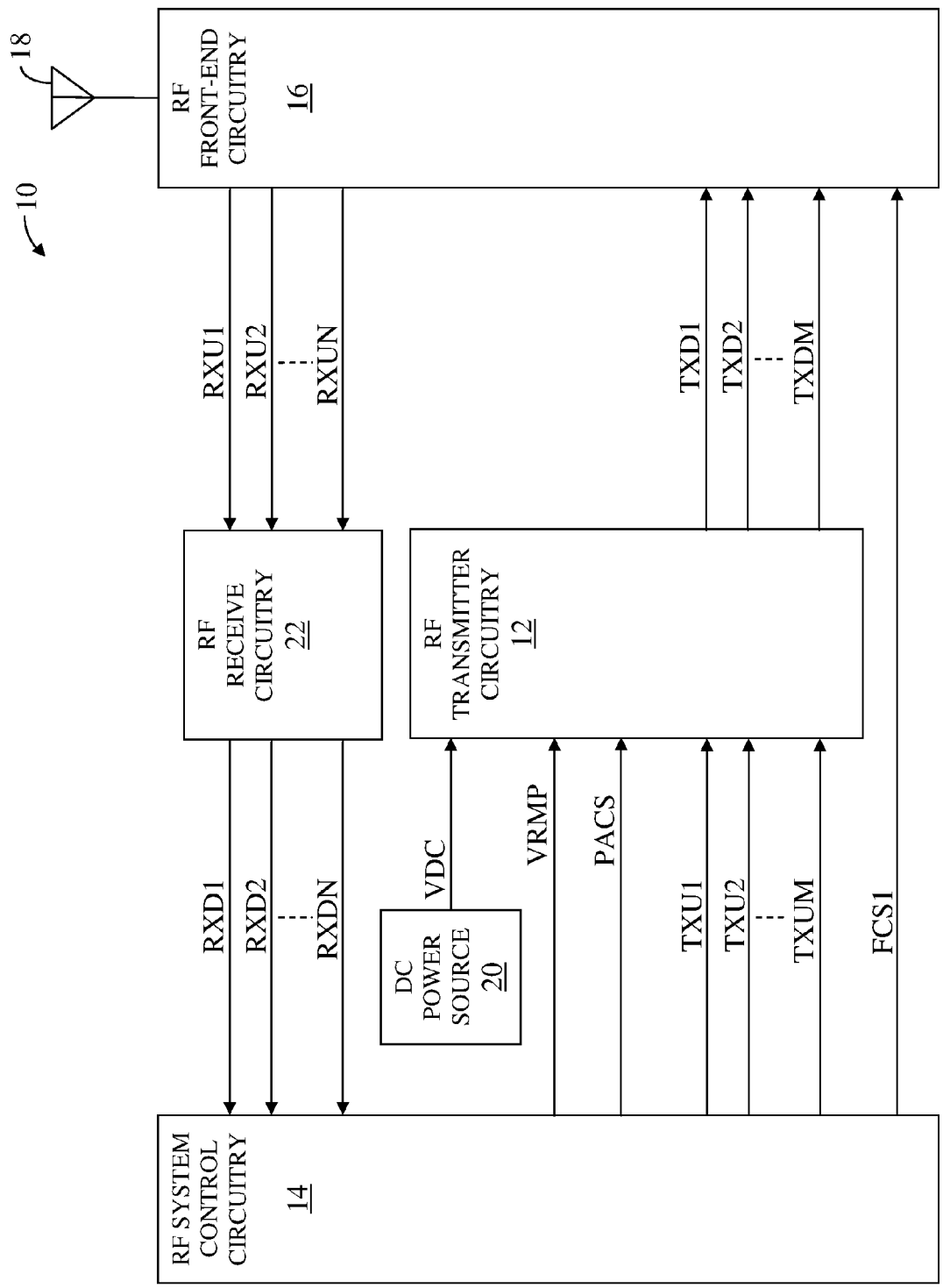
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, a first RF antenna 18, a DC power source 20, and RF receive circuitry 22.

In one embodiment of the RF communications system 10, the RF front-end circuitry 16 receives, processes, and provides a first upstream RF receive signal RXU1, a second upstream RF receive signal RXU2, and up to and including an $N^{TH}$ upstream RF receive signal RXUN to the RF receive circuitry 22. In general, the RF front-end circuitry 16 receives via the first RF antenna 18, processes and provides any or all of a group of upstream RF receive signals RXU1, RXU2, RXUN. In one embodiment of the RF receive circuitry 22, the RF receive circuitry 22 receives and processes any or all of the group of the upstream RF receive signals RXU1, RXU2, RXUN to provide a corresponding any or all of a corresponding group of downstream RF receive signals RXD1, RXD2, RXDN to the RF system control circuitry 14 to the RF system control circuitry 14.

In an additional embodiment of the RF receive circuitry 22, the RF receive circuitry 22 simultaneously receives and processes at least two of the group of upstream RF receive signals RXU1, RXU2, RXUN. As such, in one embodiment of the RF communications system 10, the RF communications system 10 provides receive downlink carrier aggregation (RXDLCA) and the upstream RF receive signals that are being received simultaneously are RXDLCA RF receive signals. The RF receive circuitry 22 may include down-conversion circuitry, control circuitry, amplification circuitry, low noise amplification circuitry, power supply circuitry, filtering circuitry, switching circuitry, combining circuitry, splitting circuitry, dividing circuitry, clocking circuitry, the like, or any combination thereof.

In one embodiment of the RF system control circuitry 14, the RF system control circuitry 14 provides a first upstream RF transmit signal TXU1, a second upstream RF transmit signal TXU2, and up to and including an $M^{TH}$ upstream RF transmit signal TXUM to the RF transmitter circuitry 12. In general, the RF system control circuitry 14 provides a group of upstream RF transmit signals TXU1, TXU2, TXUM to the RF transmitter circuitry 12.

The RF transmitter circuitry 12 processes the first upstream RF transmit signal TXU1 to provide a first downstream RF transmit signal TXD1 to the RF front-end circuitry 16, the second upstream RF transmit signal TXU2 to provide a second downstream RF transmit signal TXD2 to the RF front-end circuitry 16, and up to and including the $M^{TH}$ upstream RF transmit signal TXUM to provide an $M^{TH}$ downstream RF transmit signal TXDM to the RF front-end circuitry 16. In general, the RF transmitter circuitry 12 provides a group of downstream RF transmit signals TXD1, TXD2, TXDM to the RF front-end circuitry 16. The RF transmitter circuitry 12 may include up-conversion circuitry, amplification circuitry, power supply circuitry, control circuitry, filtering circuitry, switching circuitry, combining circuitry, splitting circuitry, dividing circuitry, clocking circuitry, the like, or any combination thereof.

The RF front-end circuitry 16 processes and transmits any or all of the group of downstream RF transmit signals TXD1, TXD2, TXDM via the first RF antenna 18. In one embodiment of the RF transmitter circuitry 12, the RF transmitter circuitry 12 provides at least two of the group of downstream RF transmit signals TXD1, TXD2, TXDM simultaneously. As such, in one embodiment of the RF communications system 10, the RF communications system 10 provides transmit uplink carrier aggregation (TXULCA) and the RF transmit signals that are being transmitted simultaneously using the RF front-end circuitry 16 are TXULCA RF transmit signals.

The RF system control circuitry 14 provides a power supply control signal VRMP and a transmitter configuration signal PACS to the RF transmitter circuitry 12. As such, the RF system control circuitry 14 may configure, tune, adjust, enable, disable, vary, or any combination thereof, circuits within the RF transmitter circuitry 12 using the power supply control signal VRMP, the transmitter configuration signal PACS, or both. The DC power source 20 provides a DC source signal VDC to the RF transmitter circuitry 12. In one embodiment of the DC power source 20, the DC power source 20 is a battery.

In one embodiment of the RF communications system 10, any or all of the group of upstream RF receive signals RXU1, RXU2, RXUN, any or all of the group of downstream RF receive signals RXD1, RXD2, RXDN, any or all of the group of upstream RF transmit signals TXU1, TXU2, TXUM, and any or all of the group of downstream RF transmit signals TXD1, TXD2, TXDM are omitted.

In one embodiment of the RF system control circuitry 14, the RF system control circuitry 14 provides a first function configuration signal FCS1 to the RF front-end circuitry 16. As such, the RF system control circuitry 14 may configure, tune, adjust, enable, disable, vary, or any combination thereof, circuits within the RF front-end circuitry 16 using the first function configuration signal FCS1.

Figure 2:
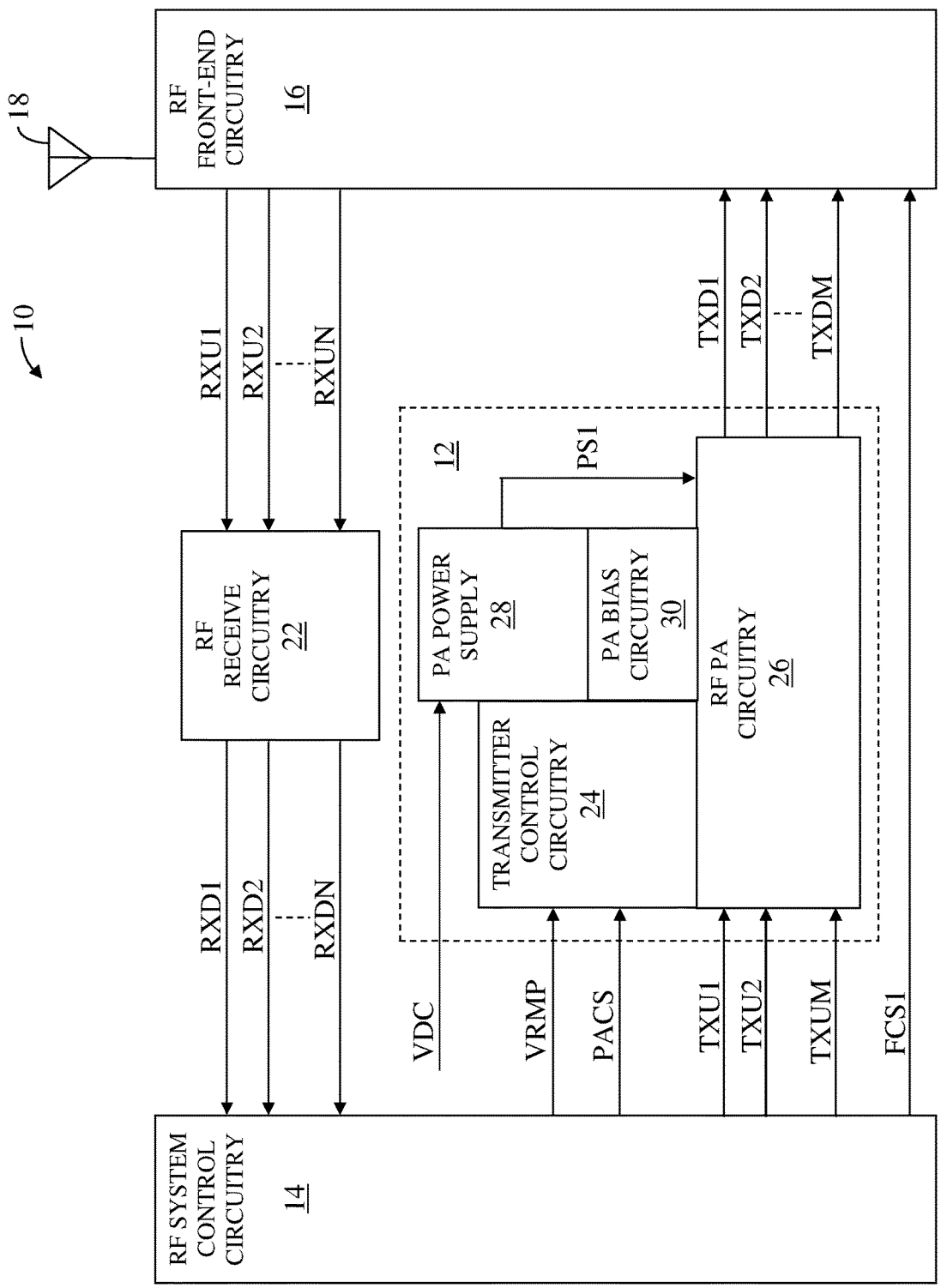
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1, except in the RF communications system 10 illustrated in FIG. 2, the RF transmitter circuitry 12 includes transmitter control circuitry 24, RF PA circuitry 26, a PA power supply 28, and PA bias circuitry 30.

The transmitter control circuitry 24 is coupled to the PA power supply 28 and the PA bias circuitry 30. The PA power supply 28 provides a first PA power supply output signal PS1 to the RF PA circuitry 26. The RF system control circuitry 14 provides any or all of the group of upstream RF transmit signals TXU1, TXU2, TXUM to the RF PA circuitry 26. The RF PA circuitry 26 receives and amplifies any or all of the group of upstream RF transmit signals TXU1, TXU2, TXUM to provide a corresponding any or all of the group of downstream RF transmit signals TXD1, TXD2, TXDM to the RF front-end circuitry 16. In one embodiment of the RF PA circuitry 26, the RF PA circuitry 26 uses the first PA power supply output signal PS1 for amplification.

Figure 3:
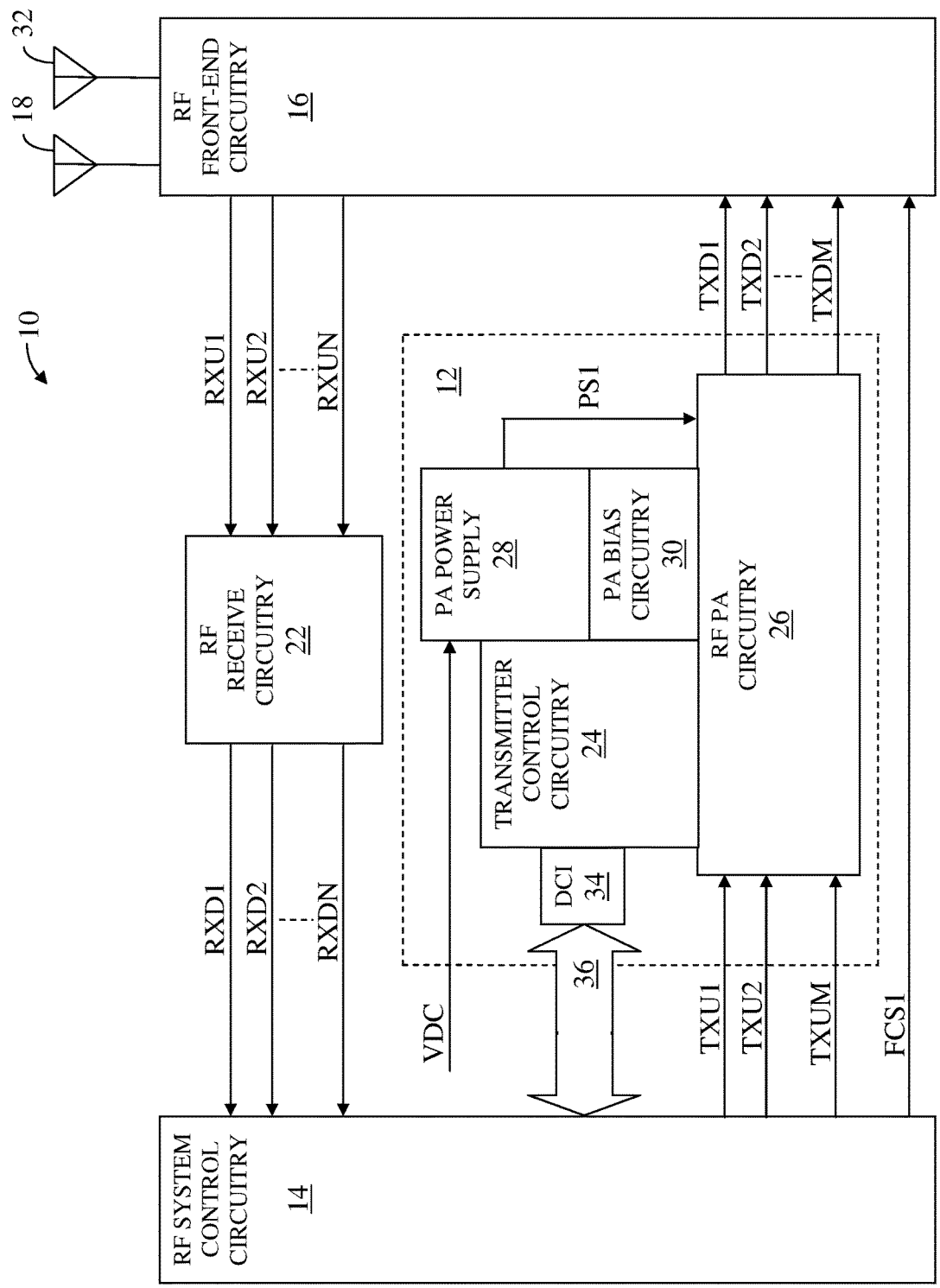
FIG. 3 shows the RF communications system according to an additional embodiment of the RF communications system.

FIG. 3 shows the RF communications system 10 according to an additional embodiment of the RF communications system 10. The RF communications system 10 illustrated in FIG. 3 is similar to the RF communications system 10 illustrated in FIG. 2, except the RF communications system 10 illustrated in FIG. 3 further includes a second RF antenna 32 coupled to the RF front-end circuitry 16. Additionally, the RF transmitter circuitry 12 further includes a digital communications interface 34, which is coupled between the transmitter control circuitry 22 and a digital communications bus 36. The digital communications bus 36 is also coupled to the RF system control circuitry 14. As such, the RF system control circuitry 14 provides the envelope power supply control signal VRMP (FIG. 1) and the transmitter configuration signal PACS (FIG. 1) to the transmitter control circuitry 22 via the digital communications bus 36 and the digital communications interface 34.

In one embodiment of the RF communications system 10, the RF front-end circuitry 16 uses the first RF antenna 18, the second RF antenna 32, or both to receive, process, and provide any or all of the group of upstream RF receive signals RXU1, RXU2, RXUN. Further, in one embodiment of the RF communications system 10, the RF front-end circuitry 16 processes and transmits any or all of the group of downstream RF transmit signals TXD1, TXD2, TXDM via using the first RF antenna 18, the second RF antenna 32, or both.

Figure 4:
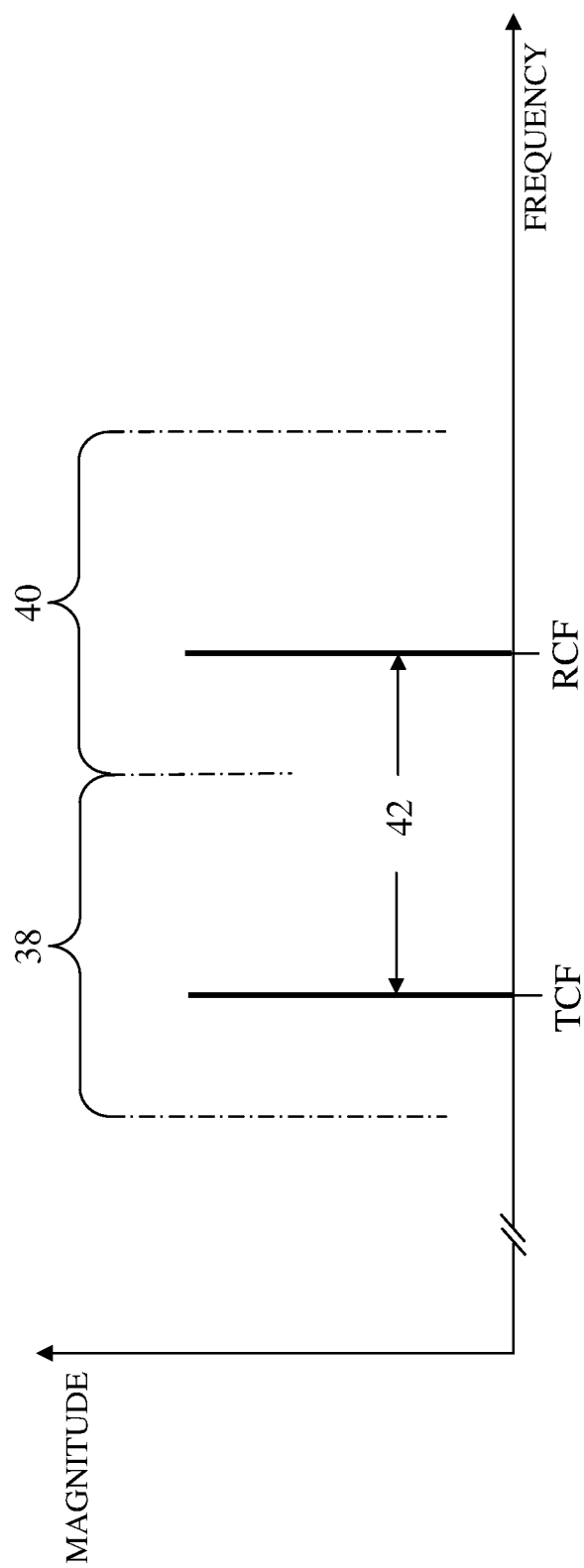
FIG. 4 is a graph illustrating a first RF transmit band associated with an RF transmit signal and a first RF receive band associated with an RF receive signal illustrated in the RF communications system illustrated in FIG. 3 according to another embodiment of the RF communications system.

FIG. 4 is a graph illustrating a first RF transmit band 38 associated with an RF transmit signal that is one of the group of downstream RF transmit signals TXD1, TXD2, TXDM (FIG. 3) and a first RF receive band 40 associated with an RF receive signal that is one of the group of upstream RF receive signals RXU1, RXU2, RXUN (FIG. 3) according to one embodiment of the RF communications system 10 (FIG. 3). As such, in the embodiment shown, the RF transmit signal and the RF receive signal are full-duplex RF signals, such that the RF transmit signal and the RF receive signal are transmitted and received, respectively, by the RF communications system 10 (FIG. 3) simultaneously. The RF transmit signal has a first transmit carrier frequency TCF and the RF receive signal has a first receive carrier frequency RCF. A first RF duplex frequency 42 is based on a difference between the first transmit carrier frequency TCF and the first receive carrier frequency RCF.

Figure 5:
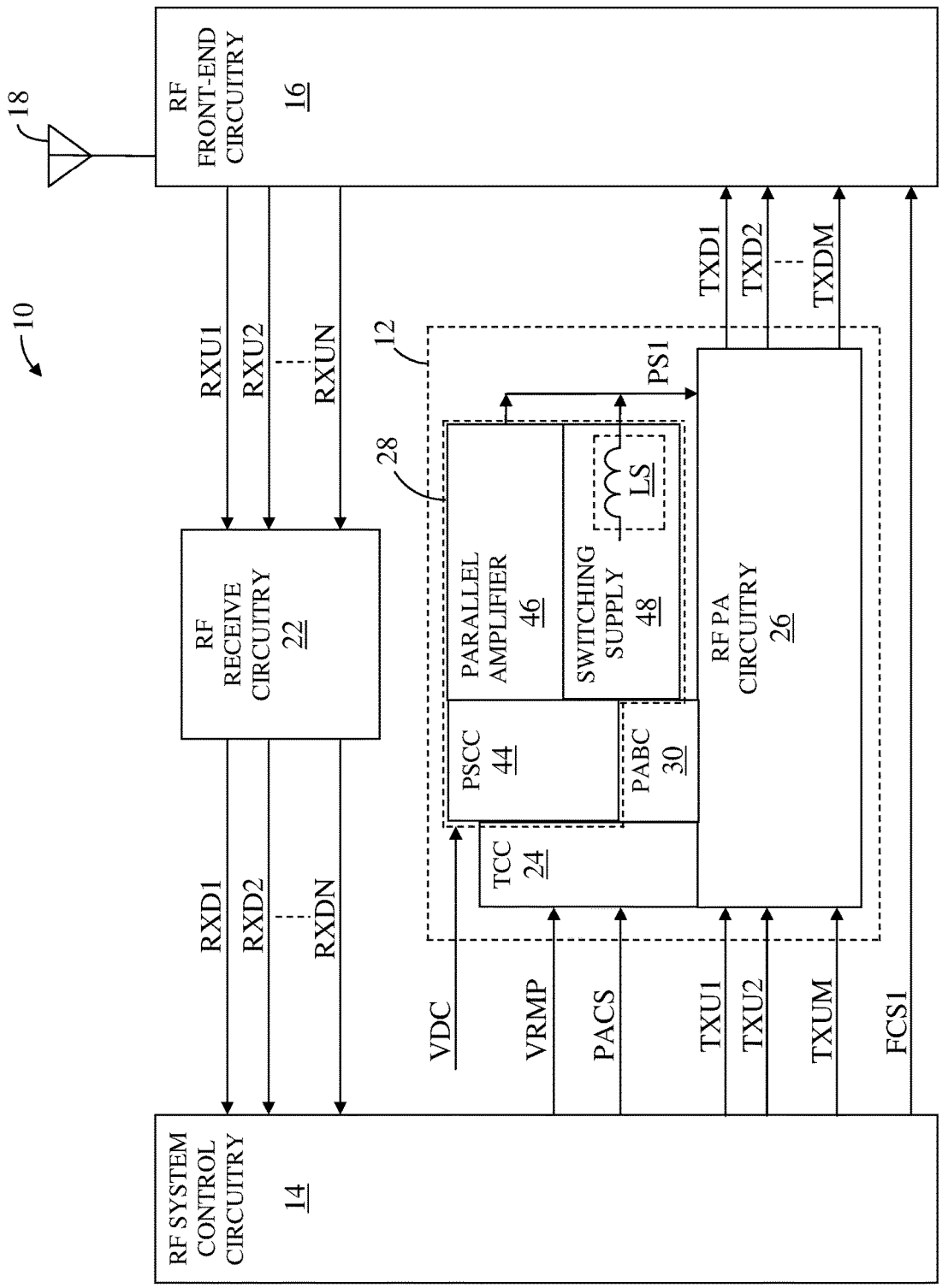
FIG. 5 shows the RF communications system according to another embodiment of the RF communications system.

FIG. 5 shows the RF communications system 10 according to another embodiment of the RF communications system 10. The RF communications system 10 illustrated in FIG. 5 is similar to the RF communications system 10 illustrated in FIG. 2, except the RF communications system 10 illustrated in FIG. 5 shows details of the PA power supply 28 according to one embodiment of the PA power supply 28. The PA power supply 28 includes power supply control circuitry 44, a parallel amplifier 46, and a switching supply 48. The power supply control circuitry 44 controls the parallel amplifier 46 and the switching supply 48. The parallel amplifier 46 and the switching supply 48 provide the first PA power supply output signal PS1. The switching supply 48 may provide power more efficiently than the parallel amplifier 46. However, the parallel amplifier 46 may provide the first PA power supply output signal PS1 more accurately than the switching supply 48, particularly when the first PA power supply output signal PS1 is used to provide envelope tracking. As such, the parallel amplifier 46 regulates a voltage of the first PA power supply output signal PS1 based on the setpoint of the first PA power supply output signal PS1, and the switching supply 48 operates to drive an output current from the parallel amplifier 46 toward zero to maximize efficiency.

In one embodiment of the switching supply 48, the switching supply 48 includes a switching supply inductive element LS, such that the first PA power supply output signal PS1 is provided via the switching supply inductive element LS. In an alternate embodiment of the PA power supply 28, the parallel amplifier 46 is omitted.

Figure 6:
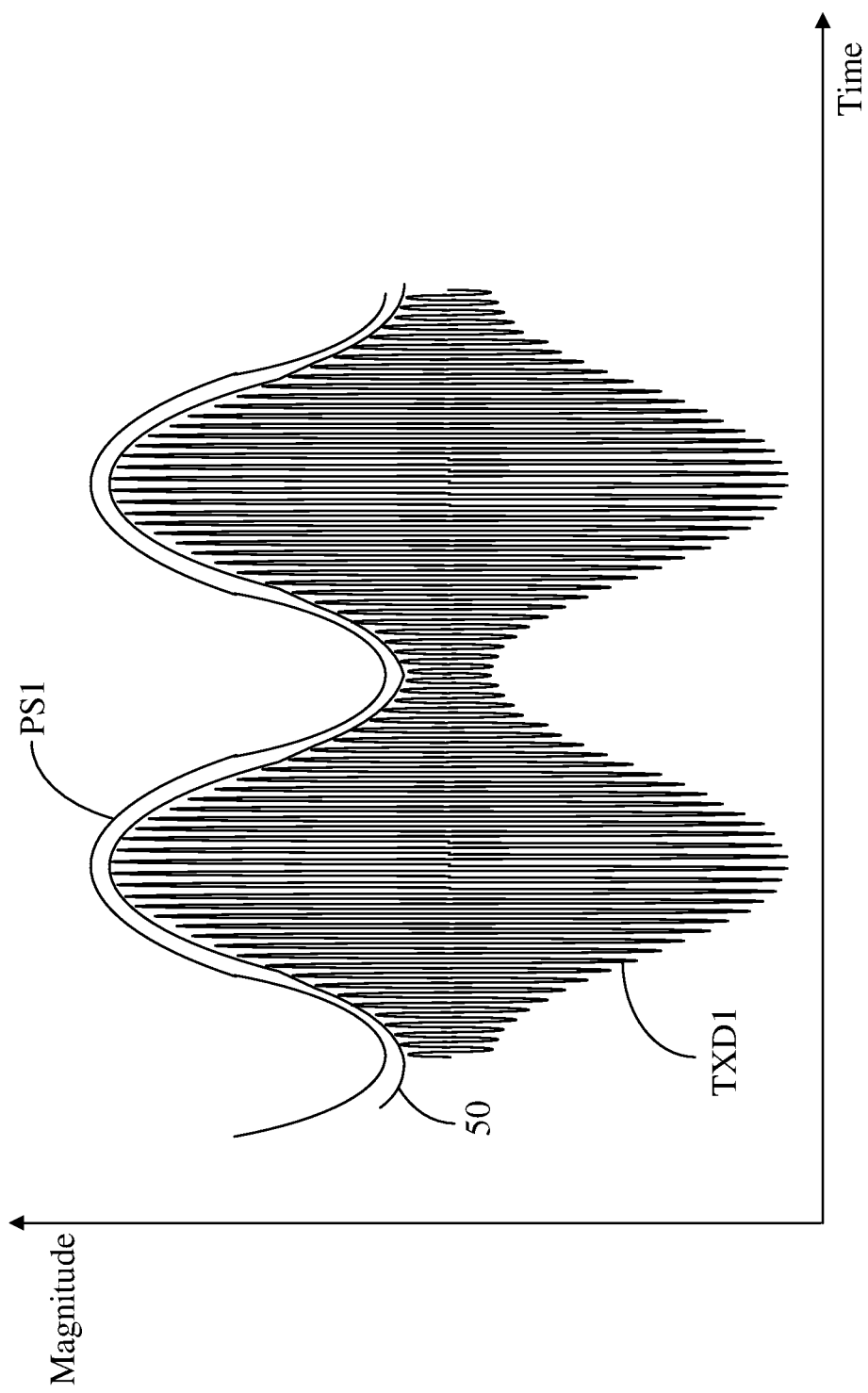
FIG. 6 is a graph showing a first downstream RF transmit signal and a first PA power supply output signal illustrated in FIG. 5 according to one embodiment of the RF communications system illustrated in FIG. 5.

FIG. 6 is a graph showing the first downstream RF transmit signal TXD1 and the first PA power supply output signal PS1 illustrated in FIG. 5 according to one embodiment of the RF communications system 10 illustrated in FIG. 5. As such, the first PA power supply output signal PS1 provides envelope tracking to each of a group 52 (FIG. 9) of RF PAs. As such, the first PA power supply output signal PS1 at least partially tracks an envelope 50 of the first downstream RF transmit signal TXD1. Tracking the envelope 50 increases efficiency of the RF communications system 10. However, as a bandwidth of the envelope 50 increases, a bandwidth of the first PA power supply output signal PS1 increases, thereby increasing bandwidth demands on the PA power supply 28 (FIG. 5), which may restrict the use of decoupling circuitry in the RF PA circuitry 26 (FIG. 5). Such decoupling circuitry may be normally used to decouple the RF PA circuitry 26 (FIG. 5) from other circuitry. As such, there is a need for decoupling circuitry that may be used in conjunction with envelope tracking.

Figure 7:
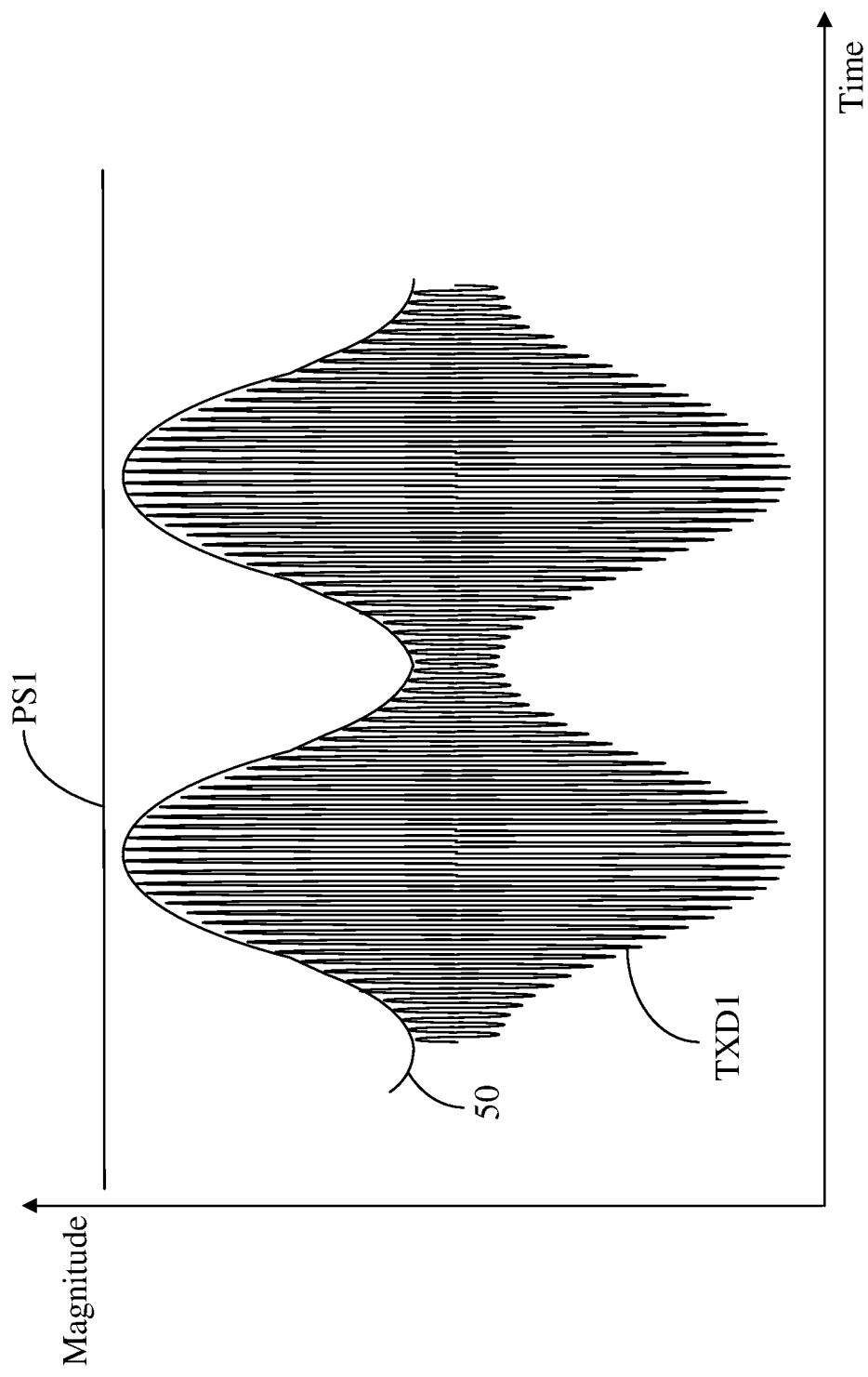
FIG. 7 is a graph showing the first downstream RF transmit signal and the first PA power supply output signal illustrated in FIG. 2 according to one embodiment of the RF communications system illustrated in FIG. 2.

FIG. 7 is a graph showing the first downstream RF transmit signal TXD1 and the first PA power supply output signal PS1 illustrated in FIG. 2 according to one embodiment of the RF communications system 10 illustrated in FIG. 2. The first downstream RF transmit signal TXD1 illustrated in FIG. 7 is similar to the first downstream RF transmit signal TXD1 illustrated in FIG. 6. However, the first PA power supply output signal PS1 illustrated in FIG. 7 does not track the envelope 50 of the first downstream RF transmit signal TXD1. Instead the magnitude of the first PA power supply output signal PS1 is about constant.

The magnitude of the first PA power supply output signal PS1 must be high enough to provide proper operation of the RF PA circuitry 26 (FIG. 2). However, as a peak output power from the RF PA circuitry 26 (FIG. 2) changes, a maximum magnitude of the envelope 50 of the first PA power supply output signal PS1 may change. Therefore, a magnitude of the first PA power supply output signal PS1 may need to be adjusted based on an average output power from the RF PA circuitry 26 (FIG. 2). Such magnitude changes of the first PA power supply output signal PS1 are called average power tracking (APT). As such, in one embodiment of the first PA power supply output signal PS1, the first PA power supply output signal PS1 provides APT to each of the group 52 (FIG. 9) of RF PAs. In this regard, a maximum allowed settling time of such magnitude changes of the first PA power supply output signal PS1 may also restrict the use of decoupling circuitry in the RF PA circuitry 26 (FIG. 2). As such, there is a need for decoupling circuitry that may be used in conjunction with APT having settling time requirements.

Figure 8:
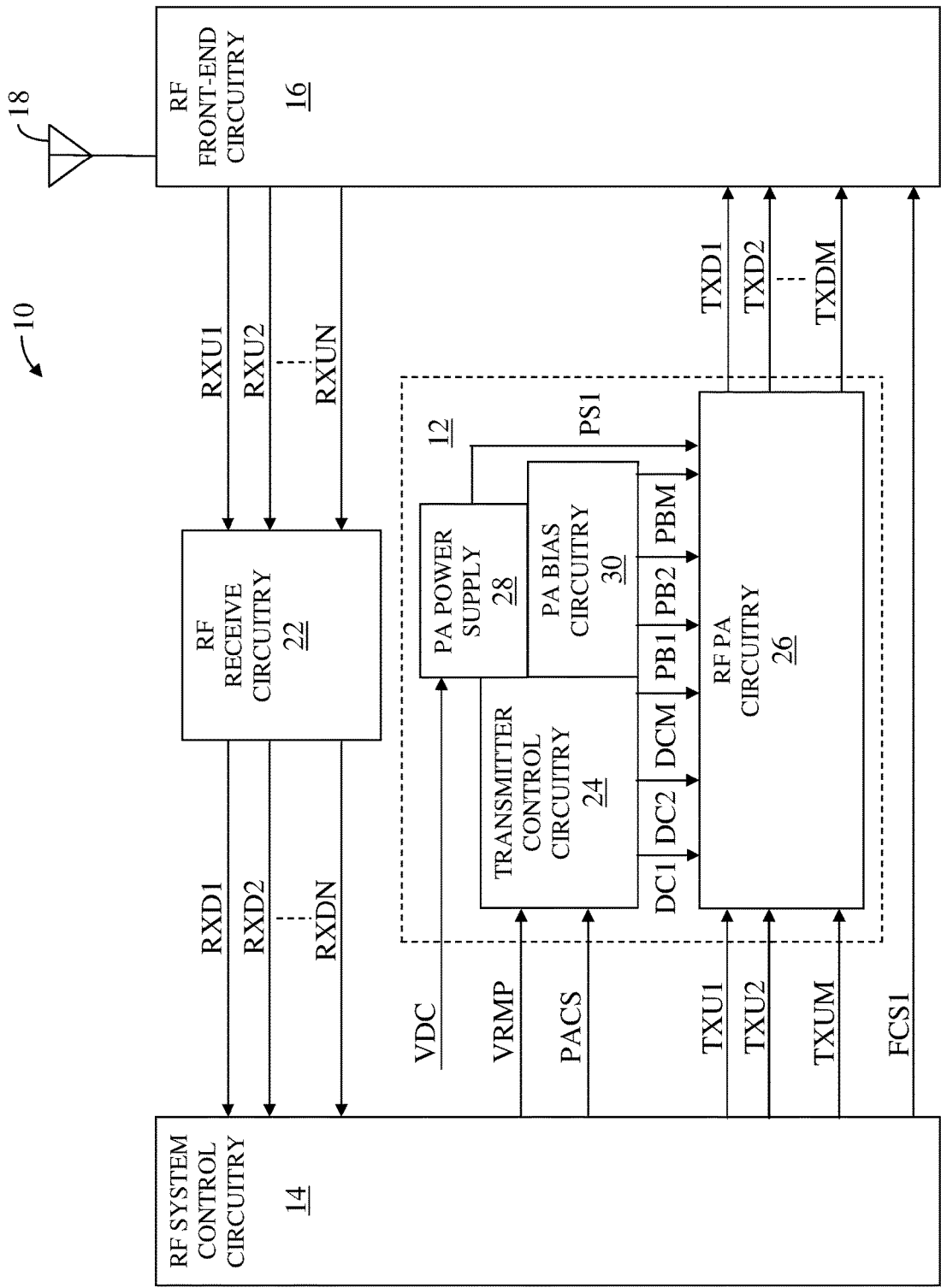
FIG. 8 shows the RF communications system according to an additional embodiment of the RF communications system.

FIG. 8 shows the RF communications system 10 according to an additional embodiment of the RF communications system 10. The RF communications system 10 illustrated in FIG. 8 is similar to the RF communications system 10 illustrated in FIG. 2, except in the RF communications system 10 illustrated in FIG. 8, the transmitter control circuitry 24 provides a first decoupling circuit control signal DC1, a second decoupling circuit control signal DC2, and up to and including an $M^{TH}$ decoupling circuit control signal DCM to the RF PA circuitry 26. In general, the transmitter control circuitry 24 provides a group of decoupling circuit control signals DC1, DC2, DCM to the RF PA circuitry 26. Additionally, the PA bias circuitry 30 provides a first PA bias signal PB1, a second PA bias signal PB2, and up to and including an $M^{TH}$ PA bias signal PBM to the RF PA circuitry 26. In general, the PA bias circuitry 30 provides a group of PA bias signals PB1, PB2, PBM to the RF PA circuitry 26.

In an alternate embodiment of the RF communications system 10, any or all of the decoupling circuit control signals DC1, DC2, DCM are omitted. In another embodiment of the RF communications system 10, any or all of the PA bias signals PB1, PB2, PBM are omitted. In one embodiment of the RF communications system 10, any or all of the decoupling circuit control signals DC1, DC2, DCM are based on the transmitter configuration signal PACS. In one embodiment of the RF communications system 10, any or all of the PA bias signals PB1, PB2, PBM are based on the transmitter configuration signal PACS.

Figure 9:
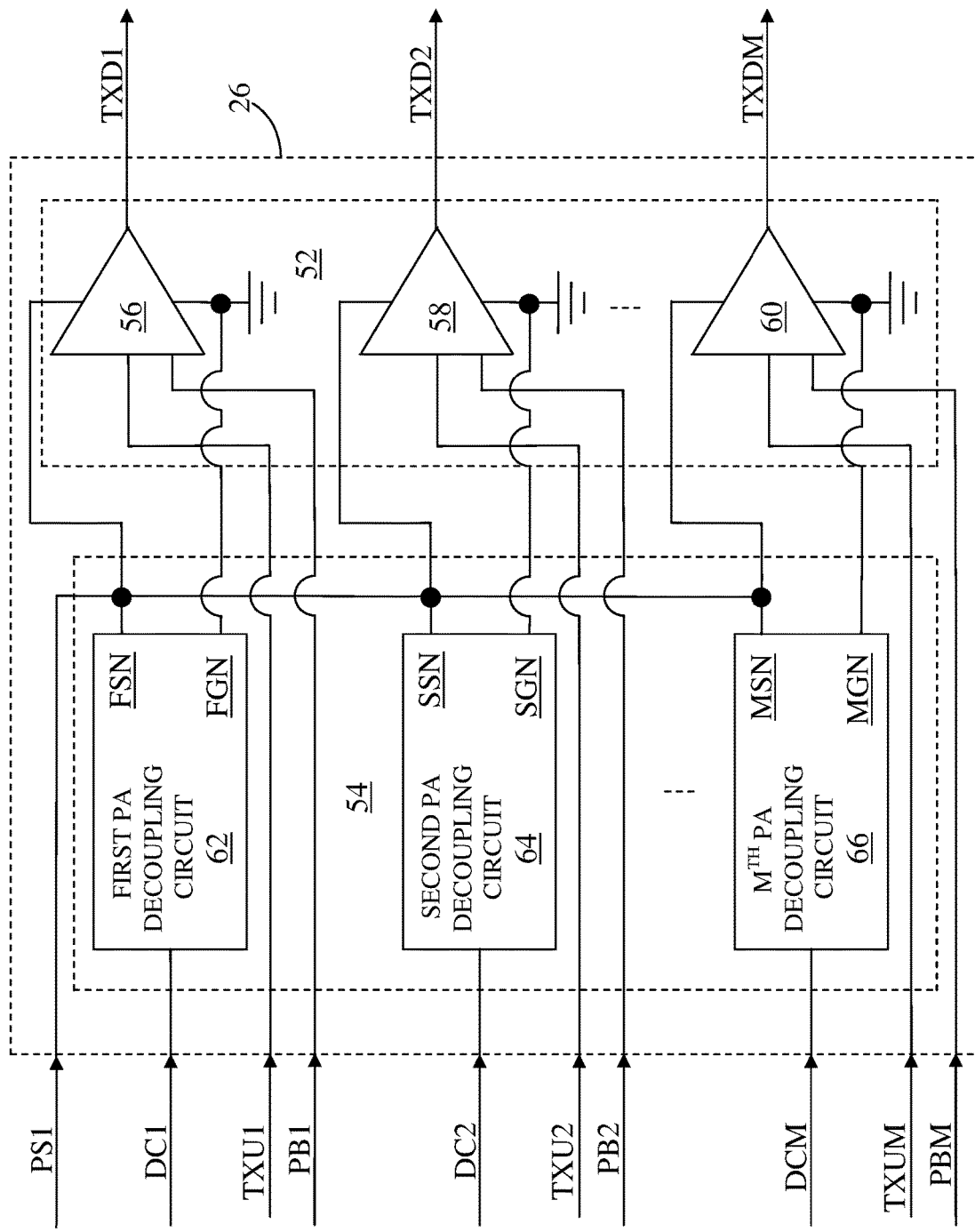
FIG. 9 shows details of the RF PA circuitry illustrated in FIG. 8 according to one embodiment of the RF PA circuitry.

FIG. 9 shows details of the RF PA circuitry 26 illustrated in FIG. 8 according to one embodiment of the RF PA circuitry 26. The RF PA circuitry 26 includes the group 52 of RF PAs and a group 54 of PA decoupling circuits. The group 52 of RF PAs includes a first RF PA 56, a second RF PA 58, and up to and including an $M^{TH}$ RF PA 60. The group 54 of PA decoupling circuits includes a first PA decoupling circuit 62, a second PA decoupling circuit 64, and up to and including an $M^{TH}$ PA decoupling circuit 66.

In one embodiment of the group 54 of PA decoupling circuits, the first PA decoupling circuit 62 is in proximity to the first RF PA 56, the second PA decoupling circuit 64 is in proximity to the second RF PA 58, and the $M^{TH}$ PA decoupling circuit 66 is in proximity to the $M^{TH}$ RF PA 60. In general, each of the group 54 of PA decoupling circuits is in proximity to a corresponding one of the group 52 of RF PAs. In one embodiment of the first PA decoupling circuit 62, the first PA decoupling circuit 62 is closer to the first RF PA 56 than to each of a balance of the group 52 of RF PAs. In one embodiment of the second PA decoupling circuit 64, the second PA decoupling circuit 64 is closer to the second RF PA 58 than to each of a balance of the group 52 of RF PAs.

Each of the group 52 of RF PAs is coupled between the PA power supply 28 (FIG. 8) and a ground. As such, the PA power supply 28 (FIG. 8) provides the first PA power supply output signal PS1 to each of the group 52 of RF PAs and each of the group 54 of PA decoupling circuits.

The first PA decoupling circuit 62 is coupled across the first RF PA 56. The second PA decoupling circuit 64 is coupled across the second RF PA 58. The $M^{TH}$ PA decoupling circuit 66 is coupled across the $M^{TH}$ RF PA 60. In general, each of the group 54 of PA decoupling circuits is coupled across a corresponding one of the group 52 of plurality of RF PAs.

In one embodiment of the first PA decoupling circuit 62, the first PA decoupling circuit 62 at least partially decouples the first RF PA 56 from other circuitry by providing a capacitance across the first RF PA 56. In one embodiment of the second PA decoupling circuit 64, the second PA decoupling circuit 64 at least partially decouples the second RF PA 58 from other circuitry by providing a capacitance across the second RF PA 58. In one embodiment of the $M^{TH}$ PA decoupling circuit 66, the $M^{TH}$ PA decoupling circuit 66 at least partially decouples the $M^{TH}$ RF PA 60 from other circuitry by providing a capacitance across the $M^{TH}$ RF PA 60. In general, each of the group 54 of PA decoupling circuits at least partially decouples a corresponding one of the group 52 of plurality of RF PAs from other circuitry by providing a corresponding capacitance across the corresponding one of the group 52 of plurality of RF PAs.

The first PA decoupling circuit 62 has a first power supply connection node FSN and a first ground connection node FGN. As such, the first power supply connection node FSN and the first ground connection node FGN are coupled across the first RF PA 56. The second PA decoupling circuit 64 has a second power supply connection node SSN and a second ground connection node SGN. As such, the second power supply connection node SSN and the second ground connection node SGN are coupled across the second RF PA 58. The $M^{TH}$ PA decoupling circuit 66 has an $M^{TH}$ power supply connection node MSN and an $M^{TH}$ ground connection node MGN. As such, the $M^{TH}$ power supply connection node MSN and the $M^{TH}$ ground connection node MGN are coupled across the $M^{TH}$ RF PA 60. In general, in one embodiment of the group 54 of PA decoupling circuits, each of the group 54 of PA decoupling circuits has a corresponding ground connection node and a corresponding power supply connection node, such that each power supply connection node and each ground connection node of the group 54 of PA decoupling circuits are coupled across a corresponding one of the group 52 of RF PAs.

In one embodiment of the group 54 of PA decoupling circuits, the first power supply connection node FSN, the second power supply connection node SSN, and up to and including the $M^{TH}$ power supply connection node MSN are coupled to the PA power supply 28 (FIG. 8). In general, each power supply connection node of the group 54 of PA decoupling circuits is coupled to the PA power supply 28 (FIG. 8).

In one embodiment of the group 54 of PA decoupling circuits, the first ground connection node FGN, the second ground connection node SGN, and up to and including the $M^{TH}$ ground connection node MGN are coupled to the ground. In general, each ground connection node of the group 54 of PA decoupling circuits is coupled to the ground.

In one embodiment of the first RF PA 56, the first RF PA 56 receives and amplifies the first upstream RF transmit signal TXU1 to provide the first downstream RF transmit signal TXD1. In one embodiment of the first RF PA 56, the first PA power supply output signal PS1 provides power to the first RF PA 56 for amplification. In one embodiment of the second RF PA 58, the second RF PA 58 receives and amplifies the second upstream RF transmit signal TXU2 to provide the second downstream RF transmit signal TXD2. In one embodiment of the second RF PA 58, the first PA power supply output signal PS1 provides power to the second RF PA 58 for amplification. In one embodiment of the $M^{TH}$ RF PA 60, the $M^{TH}$ RF PA 60 receives and amplifies the $M^{TH}$ upstream RF transmit signal TXUM to provide the $M^{TH}$ downstream RF transmit signal TXDM. In one embodiment of the $M^{TH}$ RF PA 60, the first PA power supply output signal PS1 provides power to the $M^{TH}$ RF PA 60 for amplification. In general, each of the group 52 of RF PAs receives and amplifies a corresponding one of each of a group of upstream RF transmit signals TXU1, TXU2, TXUM to provide a corresponding one of a group of downstream RF transmit signals TXD1, TXD2, TXDM.

In one embodiment of the RF PA circuitry 26, the first RF PA 56 receives the first PA bias signal PB1, the second RF PA 58 receives the second PA bias signal PB2, and the $M^{TH}$ RF PA 60 receives the $M^{TH}$ PA bias signal PBM. In general, each of the group 52 of RF PAs receives a corresponding one of a group of PA bias signals PB1, PB2, PBM.

The PA bias circuitry 30 (FIG. 8) uses the group of PA bias signals PB1, PB2, PBM to select appropriate PA biasing for each of the group 52 of RF PAs. Additionally, in one embodiment of the RF PA circuitry 26, the PA bias circuitry 30 (FIG. 8) uses the group of PA bias signals PB1, PB2, PBM to selectively enable or disable each of the group 52 of RF PAs, as needed. In this regard, in one embodiment of the group 52 of RF PAs, disabled RF PAs do not present a significant load to the PA power supply 28 (FIG. 8).

It may be unnecessary for the group 54 of PA decoupling circuits to provide decoupling for any of the group 52 of RF PAs that are disabled. In this regard, in one embodiment of the RF PA circuitry 26, when at least one of the group 52 of RF PAs is disabled, total decoupling provided by any corresponding PA decoupling circuits of the group 54 of PA decoupling circuits is reduced. Reducing the decoupling provided by the corresponding PA decoupling circuits of the group 54 of PA decoupling circuits reduces a total capacitance presented to the PA power supply 28 (FIG. 8) by the group 54 of PA decoupling circuits. By reducing the total capacitance, the PA power supply 28 (FIG. 8) may meet bandwidth requirements more efficiently, particularly when providing envelope tracking.

In one embodiment of the first PA decoupling circuit 62, the first PA decoupling circuit 62 is programmable. As such, a configuration of the first PA decoupling circuit 62 is based on the first decoupling circuit control signal DC1. In this regard, a capacitance presented by the first PA decoupling circuit 62 between the first power supply connection node FSN and the first ground connection node FGN is based on the first decoupling circuit control signal DC1. When the first RF PA 56 is disabled, in one embodiment of the first PA decoupling circuit 62, the capacitance presented by the first PA decoupling circuit 62 between the first power supply connection node FSN and the first ground connection node FGN is reduced.

In an alternate embodiment of the first PA decoupling circuit 62, the first PA decoupling circuit 62 is not programmable. As such, the first decoupling circuit control signal DC1 is omitted and the configuration of the first PA decoupling circuit 62 is fixed, such that the capacitance presented by the first PA decoupling circuit 62 between the first power supply connection node FSN and the first ground connection node FGN is fixed.

In one embodiment of the second PA decoupling circuit 64, the second PA decoupling circuit 64 is programmable. As such, a configuration of the second PA decoupling circuit 64 is based on the second decoupling circuit control signal DC2. In this regard, a capacitance presented by the second PA decoupling circuit 64 between the second power supply connection node SSN and the second ground connection node SGN is based on the second decoupling circuit control signal DC2. When the second RF PA 58 is disabled, in one embodiment of the second PA decoupling circuit 64, the capacitance presented by the second PA decoupling circuit 64 between the second power supply connection node SSN and the second ground connection node SGN is reduced.

In an alternate embodiment of the second PA decoupling circuit 64, the second PA decoupling circuit 64 is not programmable. As such, the second decoupling circuit control signal DC2 is omitted and the configuration of the second PA decoupling circuit 64 is fixed, such that the capacitance presented by the second PA decoupling circuit 64 between the second power supply connection node SSN and the second ground connection node SGN is fixed.

In one embodiment of the $M^{TH}$ PA decoupling circuit 66, the $M^{TH}$ PA decoupling circuit 66 is programmable. As such, a configuration of the $M^{TH}$ PA decoupling circuit 66 is based on the $M^{TH}$ decoupling circuit control signal DCM. In this regard, a capacitance presented by the $M^{TH}$ PA decoupling circuit 66 between the $M^{TH}$ power supply connection node MSN and the $M^{TH}$ ground connection node MGN is based on the $M^{TH}$ decoupling circuit control signal DCM. When the $M^{TH}$ RF PA 60 is disabled, in one embodiment of the $M^{TH}$ PA decoupling circuit 66, the capacitance presented by the $M^{TH}$ PA decoupling circuit 66 between the $M^{TH}$ power supply connection node MSN and the $M^{TH}$ ground connection node MGN is reduced.

In an alternate embodiment of the $M^{TH}$ PA decoupling circuit 66, the $M^{TH}$ PA decoupling circuit 66 is not programmable. As such, the $M^{TH}$ decoupling circuit control signal DCM is omitted and the configuration of the $M^{TH}$ PA decoupling circuit 66 is fixed, such that the capacitance presented by the $M^{TH}$ PA decoupling circuit 66 between the $M^{TH}$ power supply connection node MSN and the $M^{TH}$ ground connection node MGN is fixed.

In a first embodiment of the first PA decoupling circuit 62, the first PA decoupling circuit 62 is not programmable according to one embodiment of the first PA decoupling circuit 62. In a second embodiment of the first PA decoupling circuit 62, the first PA decoupling circuit 62 is programmable and capable of operating in one of an enabled state and a disabled state based on the first decoupling circuit control signal DC1. In one embodiment of the RF system control circuitry 14 (FIG. 8), the RF system control circuitry 14 (FIG. 8) selects the one of the enabled state and the disabled state of the first PA decoupling circuit 62 via the first decoupling circuit control signal DC1. During the enabled state of the first PA decoupling circuit 62, the first PA decoupling circuit 62 at least partially decouples the first RF PA 56 from other circuitry.

In a first embodiment of the second PA decoupling circuit 64, the second PA decoupling circuit 64 is not programmable according to one embodiment of the second PA decoupling circuit 64. In a second embodiment of the second PA decoupling circuit 64, the second PA decoupling circuit 64 is programmable and capable of operating in one of an enabled state and a disabled state based on the second decoupling circuit control signal DC2. In one embodiment of the RF system control circuitry 14 (FIG. 8), the RF system control circuitry 14 (FIG. 8) selects the one of the enabled state and the disabled state of the second PA decoupling circuit 64 via the second decoupling circuit control signal DC2. During the enabled state of the second PA decoupling circuit 64, the second PA decoupling circuit 64 at least partially decouples the second RF PA 58 from other circuitry.

In one embodiment of the group 54 of PA decoupling circuits, each of the group 54 of PA decoupling circuits operates in a corresponding one of an enabled state and a disabled state. In one embodiment of the group 54 of PA decoupling circuits, the first PA decoupling circuit 62 operates in the enabled state and each of a balance of the group 54 of PA decoupling circuits operates in a corresponding disabled state. In one embodiment of the group 54 of PA decoupling circuits, the first PA decoupling circuit 62 operates in the enabled state, the second PA decoupling circuit 64 operates in the enabled state, and each of a balance of the group 54 of PA decoupling circuits operates in a corresponding disabled state.

In one embodiment of the group 54 of PA decoupling circuits, one of the group 54 of PA decoupling circuits operates in the enabled state and each of a balance of the group 54 of PA decoupling circuits operates in a corresponding disabled state. In one embodiment of the group 54 of PA decoupling circuits, all of the group 54 of PA decoupling circuits that are operating in the enabled state and the switching supply inductive element LS (FIG. 5) provide a lowpass filter response. In general, as the number of the group 54 of PA decoupling circuits that simultaneously operate in the enabled mode increases, a maximum bandwidth of the first PA power supply output signal PS1 decreases. As such, to allow proper operation of envelope tracking, in one embodiment of the group 54 of PA decoupling circuits, the number of the group 54 of PA decoupling circuits that simultaneously operate in the enabled mode is limited. In one embodiment of the group 54 of PA decoupling circuits, at least one of the group 54 of PA decoupling circuits is not programmable.

In one embodiment of the first RF PA 56, the first RF PA 56 is capable of operating in one of an enabled state and a disabled state based on the first PA bias signal PB1. In one embodiment of the RF system control circuitry 14 (FIG. 8), the RF system control circuitry 14 (FIG. 8) selects the one of the enabled state and the disabled state of the first RF PA 56 via the first PA bias signal PB1. When in the enabled state, the first RF PA 56 receives and amplifies the first upstream RF transmit signal TXU1 to provide the first downstream RF transmit signal TXD1 using the first PA power supply output signal PS1.

In one embodiment of the second RF PA 58, the second RF PA 58 is capable of operating in one of an enabled state and a disabled state based on the second PA bias signal PB2. In one embodiment of the RF system control circuitry 14 (FIG. 8), the RF system control circuitry 14 (FIG. 8) selects the one of the enabled state and the disabled state of the second RF PA 58 via the second PA bias signal PB2. When in the enabled state, the second RF PA 58 receives and amplifies the second upstream RF transmit signal TXU2 to provide the second downstream RF transmit signal TXD2 using the first PA power supply output signal PS1.

In one embodiment of the group 52 of RF PAs, each of the group 52 of RF PAs operates in a corresponding one of an enable state and a disabled state. In one embodiment of the group 52 of RF PAs, the first RF PA 56 operates in the enabled state and each of a balance of the group 52 of RF PAs operates in a corresponding disabled state. In one embodiment of the group 52 of RF PAs, the first RF PA 56 operates in the enabled state, the second RF PA 58 operates in the enabled state, and each of a balance of the group 52 of RF PAs operates in a corresponding disabled state. In one embodiment of the group 52 of RF PAs, one of the group 52 of RF PAs operates in the enabled state and each of a balance of the group 52 of RF PAs operates in a corresponding disabled state.

In one embodiment of the first RF PA 56 and the second RF PA 58, the first RF PA 56 and the second RF PA 58 provide the first downstream RF transmit signal TXD1 and the second downstream RF transmit signal TXD2, respectively, simultaneously. As such, in one embodiment of the first downstream RF transmit signal TXD1 and the second downstream RF transmit signal TXD2, the first downstream RF transmit signal TXD1 and the second downstream RF transmit signal TXD2 are TXULCA RF transmit signals.

Figure 10A:
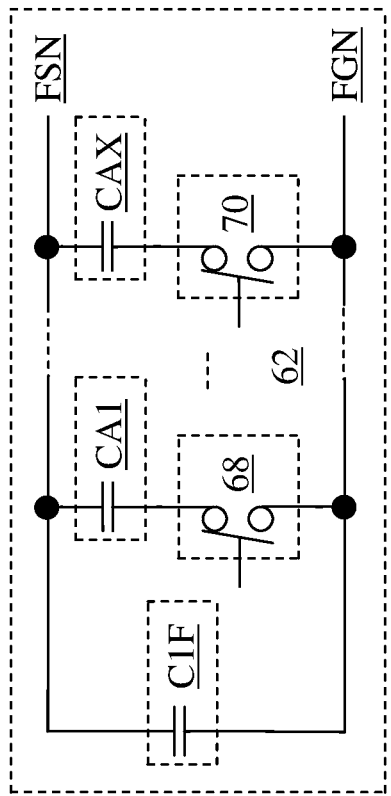
FIGS. 10A and 10B show details of a first PA decoupling circuit and a second PA decoupling circuit, respectively, illustrated in FIG. 9 according to one embodiment of the first PA decoupling circuit and the second PA decoupling circuit.
Figure 10B:
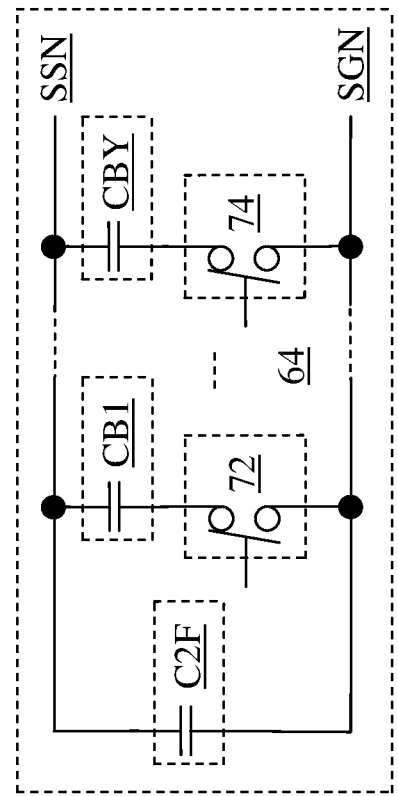

FIGS. 10A and 10B show details of the first PA decoupling circuit 62 and the second PA decoupling circuit 64, respectively, illustrated in FIG. 9 according to one embodiment of the first PA decoupling circuit 62 and the second PA decoupling circuit 64. The first PA decoupling circuit 62 illustrated in FIG. 10A includes the first power supply connection node FSN, the first ground connection node FGN, a first fixed capacitive element C1F, a first alpha switched capacitive element CA1 and up to an including an $X^{TH}$ alpha switched capacitive element CAX, and a first alpha switching element 68 and up to and including an $X^{TH}$ alpha switching element 70.

The first fixed capacitive element C1F is coupled between the first power supply connection node FSN and the first ground connection node FGN. The first alpha switching element 68 and the first alpha switched capacitive element CA1 are coupled in series between the first power supply connection node FSN and the first ground connection node FGN. The $X^{TH}$ alpha switching element 70 and the $X^{TH}$ alpha switched capacitive element CAX are coupled in series between the first power supply connection node FSN and the first ground connection node FGN.

Each of the alpha switching elements 68, 70 of the first PA decoupling circuit 62 is in one of an ON state and an OFF state based on the first decoupling circuit control signal DC1. As such, a first total capacitance of the first PA decoupling circuit 62 between the first power supply connection node FSN and the first ground connection node FGN is essentially equal to a sum of a capacitance of the first fixed capacitive element C1F and a capacitance of each of the alpha switched capacitive elements CA1, CAX that have respective switching elements in the ON state.

In an alternate embodiment of the first PA decoupling circuit 62, the alpha switching elements 68, 70, the alpha switched capacitive elements CA1, CAX, and the first decoupling circuit control signal DC1 are omitted. As such, the first PA decoupling circuit 62 is not programmable and the first total capacitance of the first PA decoupling circuit 62 is essentially equal to the capacitance of the first fixed capacitive element C1F.

In an additional embodiment of the first PA decoupling circuit 62, the first fixed capacitive element C1F is omitted. As such, the first total capacitance of the first PA decoupling circuit 62 between the first power supply connection node FSN and the first ground connection node FGN is essentially equal to a sum of the capacitance of each of the alpha switched capacitive elements CA1, CAX that have respective switching elements in the ON state. As such, if all of the alpha switching elements 68, 70 are in the OFF state, then the first total capacitance of the first PA decoupling circuit 62 is essentially equal to zero.

The second PA decoupling circuit 64 illustrated in FIG. 10B includes the second power supply connection node SSN, the second ground connection node SGN, a second fixed capacitive element C2F, a first beta switched capacitive element CB1 and up to an including an $Y^{TH}$ beta switched capacitive element CBY, a first beta switching element 72 and up to and including an $Y^{TH}$ beta switching element 74.

The second fixed capacitive element C2F is coupled between the second power supply connection node SSN and the second ground connection node SGN. The first beta switching element 72 and the first beta switched capacitive element CB1 are coupled in series between the second power supply connection node SSN and the second ground connection node SGN. The $Y^{TH}$ beta switching element 74 and the $Y^{TH}$ beta switched capacitive element CBY are coupled in series between the second power supply connection node SSN and the second ground connection node SGN.

Each of the beta switching elements 72, 74 of the second PA decoupling circuit 64 is in one of an ON state and an OFF state based on the second decoupling circuit control signal DC2. As such, a second total capacitance of the second PA decoupling circuit 64 between the second power supply connection node SSN and the second ground connection node SGN is essentially equal to a sum of a capacitance of the second fixed capacitive element C2F and a capacitance of each of the beta switched capacitive elements CB1, CBY that have respective switching elements in the ON state.

In an alternate embodiment of the second PA decoupling circuit 64, the beta switching elements 72, 74, the beta switched capacitive elements CB1, CBY, and the second decoupling circuit control signal DC2 are omitted. As such, the second PA decoupling circuit 64 is not programmable and the second total capacitance of the second PA decoupling circuit 64 is essentially equal to the capacitance of the second fixed capacitive element C2F.

In an additional embodiment of the second PA decoupling circuit 64, the second fixed capacitive element C2F is omitted. As such, the second total capacitance of the second PA decoupling circuit 64 between the second power supply connection node SSN and the second ground connection node SGN is essentially equal to a sum of the capacitance of each of the beta switched capacitive elements CB1, CBY that have respective switching elements in the ON state. As such, if all of the beta switching elements 72, 74 are in the OFF state, then the second total capacitance of the second PA decoupling circuit 64 is essentially equal to zero.

In the first embodiment of the first PA decoupling circuit 62, the first PA decoupling circuit 62 is not programmable. In this embodiment, all of the first alpha switching element 68 up to and including the $X^{TH}$ alpha switching element 70 are omitted; and all of the first alpha switched capacitive element CA1 up to and including the $X^{TH}$ alpha switched capacitive element CAX are omitted. Therefore, the first fixed capacitive element C1F provides the first total capacitance between the first power supply connection node FSN and the first ground connection node FGN, thereby providing the capacitance across the first RF PA 56 (FIG. 9).

In the second embodiment of the first PA decoupling circuit 62, the first PA decoupling circuit 62 is programmable and capable of operating in one of the enabled state and the disabled state based on the first decoupling circuit control signal DC1 (FIG. 9). In this embodiment, the first fixed capacitive element C1F is omitted. As such, when the first PA decoupling circuit 62 is operating in the disabled state, all of the alpha switching elements 68, 70 are in the OFF state based on the first decoupling circuit control signal DC1 (FIG. 9), such that the first total capacitance between the first power supply connection node FSN and the first ground connection node FGN is essentially equal to zero. When the first PA decoupling circuit 62 is operating in the enabled state, at least one of the alpha switching elements 68, 70 is in the ON state based on the first decoupling circuit control signal DC1 (FIG. 9), such that the first total capacitance between the first power supply connection node FSN and the first ground connection node FGN is based on the alpha switching elements 68, 70 that are in the ON state, thereby providing the capacitance across the first RF PA 56 (FIG. 9).

In the first embodiment of the second PA decoupling circuit 64, the second PA decoupling circuit 64 is not programmable. In this embodiment, all of the first beta switching element 72 up to and including the $Y^{TH}$ beta switching element 74 are omitted; and all of the first beta switched capacitive element CB1 up to and including the $Y^{TH}$ beta switched capacitive element CBY are omitted. Therefore, the second fixed capacitive element C2F provides the second total capacitance between the second power supply connection node SSN and the second ground connection node SGN, thereby providing the capacitance across the second RF PA 58 (FIG. 9).

In the second embodiment of the second PA decoupling circuit 64, the second PA decoupling circuit 64 is programmable and capable of operating in one of the enabled state and the disabled state based on the second decoupling circuit control signal DC2 (FIG. 9). In this embodiment, the second fixed capacitive element C2F is omitted. As such, when the second PA decoupling circuit 64 is operating in the disabled state, all of the beta switching elements 72, 74 are in the OFF state based on the second decoupling circuit control signal DC2 (FIG. 9), such that the second total capacitance between the second power supply connection node SSN and the second ground connection node SGN is essentially equal to zero. When the second PA decoupling circuit 64 is operating in the enabled state, at least one of the beta switching elements 72, 74 is in the ON state based on the second decoupling circuit control signal DC2 (FIG. 9), such that the second total capacitance between second power supply connection node SSN and the second ground connection node SGN is based on the beta switching elements 72, 74 that are in the ON state, thereby providing the capacitance across the second RF PA 58 (FIG. 9).

Figure 11A:
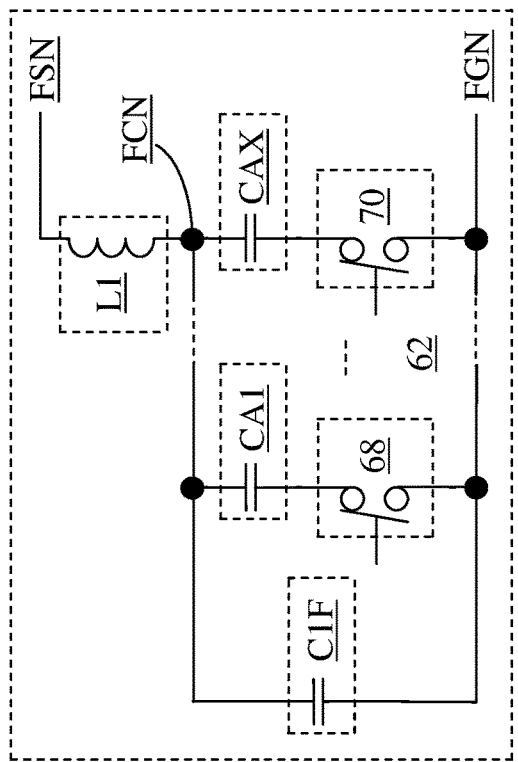
FIGS. 11A and 11B show details of the first PA decoupling circuit and the second PA decoupling circuit, respectively, illustrated in FIG. 9 according to an alternate embodiment of the first PA decoupling circuit and the second PA decoupling circuit.
Figure 11B:
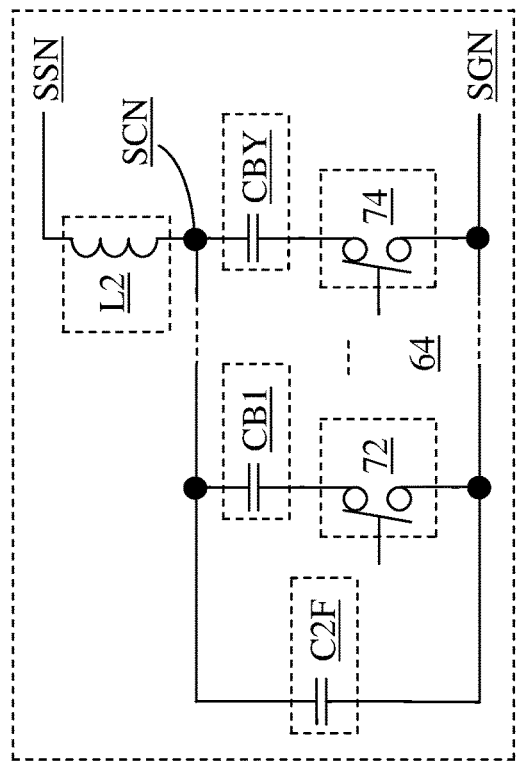

FIGS. 11A and 11B show details of the first PA decoupling circuit 62 and the second PA decoupling circuit 64, respectively, illustrated in FIG. 9 according to an alternate embodiment of the first PA decoupling circuit 62 and the second PA decoupling circuit 64. The first PA decoupling circuit 62 illustrated in FIG. 11A includes the first power supply connection node FSN, a first connection node FCN, the first ground connection node FGN, the first fixed capacitive element C1F, the first alpha switched capacitive element CA1 and up to and including the $X^{TH}$ alpha switched capacitive element CAX, the first alpha switching element 68 and up to and including the $X^{TH}$ alpha switching element 70, and a first inductive element L1.

The first inductive element L1 is coupled between the first power supply connection node FSN and the first connection node FCN. The first fixed capacitive element C1F is coupled between the first connection node FCN and the first ground connection node FGN. The first alpha switching element 68 and the first alpha switched capacitive element CA1 are coupled in series between the first connection node FCN and the first ground connection node FGN. The $X^{TH}$ alpha switching element 70 and the $X^{TH}$ alpha switched capacitive element CAX are coupled in series between the first connection node FCN and the first ground connection node FGN.

Each of the alpha switching elements 68, 70 of the first PA decoupling circuit 62 is in one of the ON state and the OFF state based on the first decoupling circuit control signal DC1. As such, the first total capacitance of the first PA decoupling circuit 62 is essentially equal to a sum of the capacitance of the first fixed capacitive element C1F and the capacitance of each of the alpha switched capacitive elements CA1, CAX that have respective switching elements in the ON state.

In an alternate embodiment of the first PA decoupling circuit 62, the alpha switching elements 68, 70, the alpha switched capacitive elements CA1, CAX, and the first decoupling circuit control signal DC1 are omitted. As such, the first PA decoupling circuit 62 is not programmable and the first total capacitance of the first PA decoupling circuit 62 is essentially equal to the capacitance of the first fixed capacitive element C1F.

In an additional embodiment of the first PA decoupling circuit 62, the first fixed capacitive element C1F is omitted. As such, the first total capacitance of the first PA decoupling circuit 62 is essentially equal to a sum of the capacitance of each of the alpha switched capacitive elements CA1, CAX that have respective switching elements in the ON state. As such, if all of the alpha switching elements 68, 70 are in the OFF state, then the first total capacitance of the first PA decoupling circuit 62 is essentially equal to zero.

In one embodiment of the first PA decoupling circuit 62, the first PA decoupling circuit 62 is programmable and capable of operating in one of the enabled state and the disabled state based on the first decoupling circuit control signal DC1 (FIG. 9). In this embodiment, the first fixed capacitive element C1F is omitted. As such, when the first PA decoupling circuit 62 is operating in the disabled state, all of the alpha switching elements 68, 70 are in the OFF state based on the first decoupling circuit control signal DC1 (FIG. 9), such that the first total capacitance is essentially equal to zero. When the first PA decoupling circuit 62 is operating in the enabled state, at least one of the alpha switching elements 68, 70 is in the ON state based on the first decoupling circuit control signal DC1 (FIG. 9), such that the first total capacitance is based on the alpha switching elements 68, 70 that are in the ON state.

The second PA decoupling circuit 64 illustrated in FIG. 11B includes the second power supply connection node SSN, a second connection node SCN, the second ground connection node SGN, a second inductive element L2, the second fixed capacitive element C2F, the first beta switched capacitive element CB1 and up to the including a $Y^{TH}$ beta switched capacitive element CBY, the first beta switching element 72 and up to and including the $Y^{TH}$ beta switching element 74.

The second inductive element L2 is coupled between the second power supply connection node SSN and the second connection node SCN. The second fixed capacitive element C2F is coupled between the second connection node SCN and the second ground connection node SGN. The first beta switching element 72 and the first beta switched capacitive element CB1 are coupled in series between the second connection node SCN and the second ground connection node SGN. The $Y^{TH}$ beta switching element 74 and the $Y^{TH}$ beta switched capacitive element CBY are coupled in series between the second connection node SCN and the second ground connection node SGN.

Each of the beta switching elements 72, 74 of the second PA decoupling circuit 64 is in one of the ON state and the OFF state based on the second decoupling circuit control signal DC2. As such, a second total capacitance of the second PA decoupling circuit 64 is essentially equal to a sum of the capacitance of the second fixed capacitive element C2F and the capacitance of each of the beta switched capacitive elements CB1, CBY that have respective switching elements in the ON state.

In an alternate embodiment of the second PA decoupling circuit 64, the beta switching elements 72, 74, the beta switched capacitive elements CB1, CBY, and the second decoupling circuit control signal DC2 are omitted. As such, the second PA decoupling circuit 64 is not programmable and the second total capacitance of the second PA decoupling circuit 64 is essentially equal to the capacitance of the second fixed capacitive element C2F.

In an additional embodiment of the second PA decoupling circuit 64, the second fixed capacitive element C2F is omitted. As such, the second total capacitance of the second PA decoupling circuit 64 is essentially equal to a sum of the capacitance of each of the beta switched capacitive elements CB1, CBY that have respective switching elements in the ON state. As such, if all of the beta switching elements 72, 74 are in the OFF state, then the second total capacitance of the second PA decoupling circuit 64 is essentially equal to zero.

In one embodiment of the second PA decoupling circuit 64, the second PA decoupling circuit 64 is programmable and capable of operating in one of an enabled state and a disabled state based on the second decoupling circuit control signal DC2 (FIG. 9). In this embodiment, the second fixed capacitive element C2F is omitted. As such, when the second PA decoupling circuit 64 is operating in the disabled state, all of the beta switching elements 72, 74 are in the OFF state based on the second decoupling circuit control signal DC2 (FIG. 9), such that the second total capacitance provided by the second PA decoupling circuit 64 is essentially equal to zero. When the second PA decoupling circuit 64 is operating in the enabled state, at least one of the beta switching elements 72, 74 is in the ON state based on the second decoupling circuit control signal DC2 (FIG. 9), such that the second total capacitance provided by the second PA decoupling circuit 64 is based on the beta switching elements 72, 74 that are in the ON state.

Figure 12:
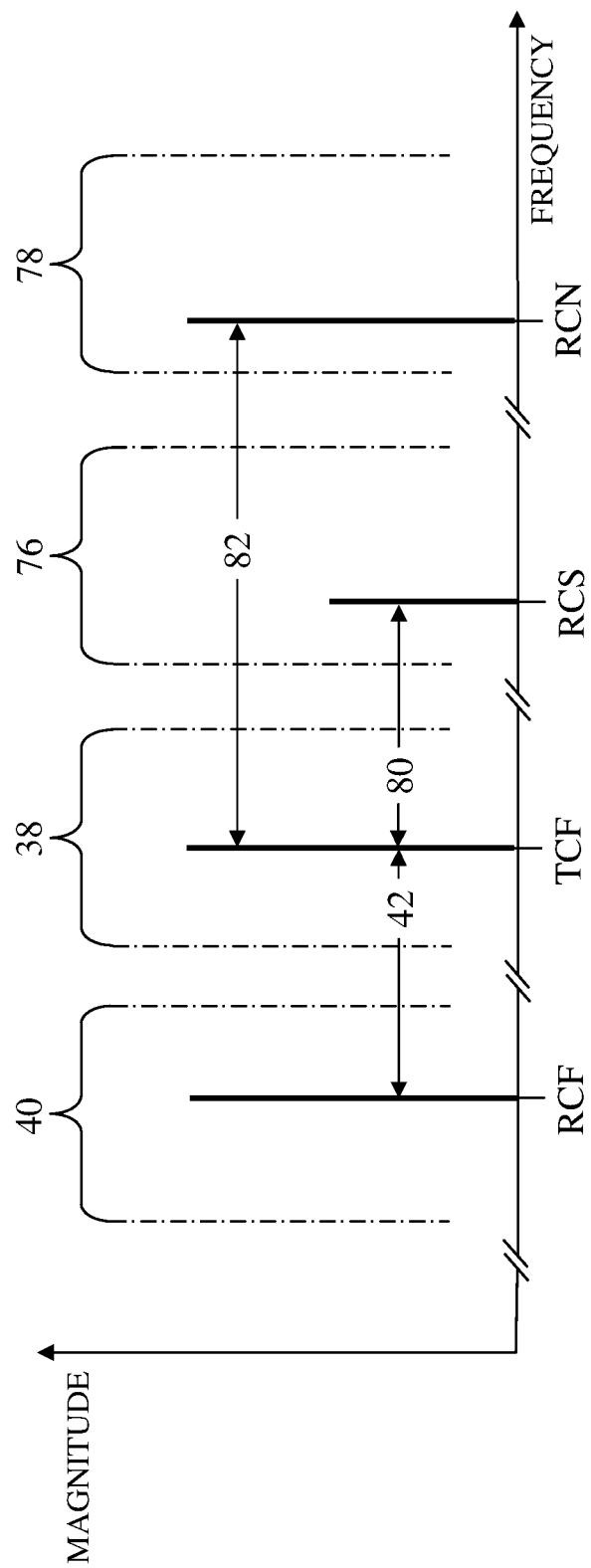
FIG. 12 is a graph illustrating the first RF transmit band, the first RF receive band, a second RF receive band, and an $N^{TH}$ RF receive band associated with the RF communications system illustrated in FIG. 1 according to one embodiment of the RF communications system.

FIG. 12 is a graph illustrating the first RF transmit band 38 (FIG. 4), the first RF receive band 40 (FIG. 4), a second RF receive band 76, and an $N^{TH}$ RF receive band 78 associated with the RF communications system 10 illustrated in FIG. 1 according to one embodiment of the RF communications system 10. As such, in one embodiment of the RF communications system 10, the RF communications system 10 is transmitting the first downstream RF transmit signal TXD1 in the first RF transmit band 38, and simultaneously receiving the first upstream RF receive signal RXU1 in the first RF receive band 40, the second upstream RF receive signal RXU2 in the second RF receive band 76, and the $N^{TH}$ upstream RF receive signal RXUN in the $N^{TH}$ RF receive band 78.

As such, the first downstream RF transmit signal TXD1 has the first transmit carrier frequency TCF, which is within the first RF transmit band 38; the first upstream RF receive signal RXU1 has the first receive carrier frequency RCF, which is within the first RF receive band 40; the second upstream RF receive signal RXU2 has a second receive carrier frequency RCS, which is within the second RF receive band 76; and the $N^{TH}$ upstream RF receive signal RXUN has an $N^{TH}$ receive carrier frequency RCN, which is within the $N^{TH}$ RF receive band 78.

In one embodiment of the RF communications system 10 (FIG. 1), the RF communications system 10 (FIG. 1) transmits the first downstream RF transmit signal TXD1 and receives the first upstream RF receive signal RXU1, the second upstream RF receive signal RXU2, and the $N^{TH}$ upstream RF receive signal RXUN simultaneously, such that the first upstream RF receive signal RXU1, the second upstream RF receive signal RXU2, and the $N^{TH}$ upstream RF receive signal RXUN are RXDLCA RF receive signals.

In this regard, the first RF duplex frequency 42 is based on the difference between the first transmit carrier frequency TCF and the first receive carrier frequency RCF. A second RF duplex frequency 80 is based on a difference between the first transmit carrier frequency TCF and the second receive carrier frequency RCS. An $N^{TH}$ RF duplex frequency 82 is based on a difference between the first transmit carrier frequency TCF and the $N^{TH}$ receive carrier frequency RCN.

Figure 13:
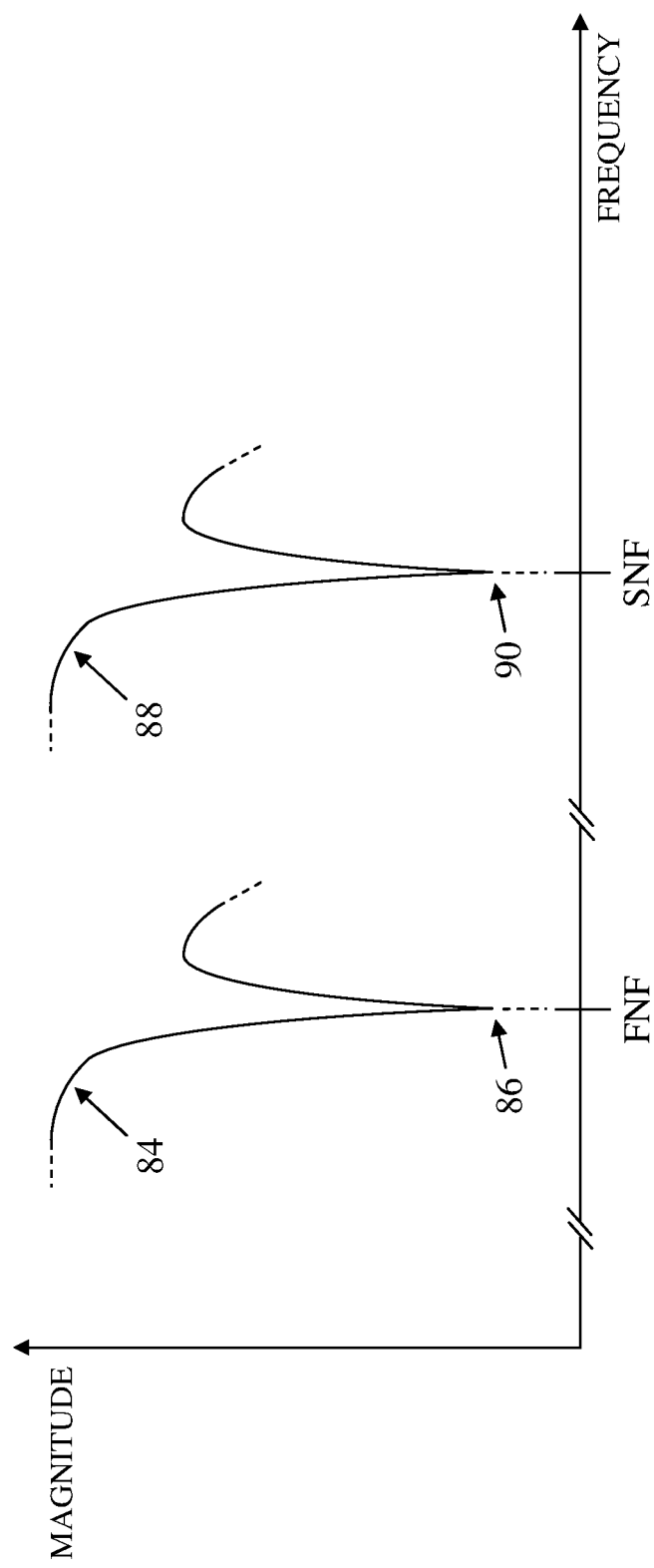
FIG. 13 is a graph illustrating a first frequency response, which has a first RF notch, of a first notch filter; and further illustrating a second frequency response, which has a second RF notch, of a second notch filter according to one embodiment of the RF communications system.

FIG. 13 is a graph illustrating a first frequency response 84, which has a first RF notch 86, of a first notch filter; and further illustrating a second frequency response 88, which has a second RF notch 90, of a second notch filter according to one embodiment of the RF communications system 10. The first RF notch 86 has a first notch frequency FNF and the second RF notch 90 has a second notch frequency SNF. In one embodiment of the first frequency response 84, the first frequency response 84 is based on a first inductance and a first capacitance. In one embodiment of the second frequency response 88, the second frequency response 88 is based on a second inductance and a second capacitance.

In one embodiment of the first notch filter, the first PA decoupling circuit 62 (FIG. 9) provides the first notch filter. The first inductive element L1 (FIG. 11A) has a first inductance and the first PA decoupling circuit 62 (FIG. 11A) provides a first total capacitance, such that the first frequency response 84 is based on the first inductance and the first total capacitance.

In one embodiment of the first notch filter, the first notch frequency FNF is essentially equal to the first RF duplex frequency 42 (FIG. 12). In another embodiment of the first notch filter, the first notch frequency FNF is essentially equal to the second RF duplex frequency 80 (FIG. 12). In a further embodiment of the first notch filter, the first notch frequency FNF is essentially equal to the $N^{TH}$ RF duplex frequency 82.

In one embodiment of the second notch filter, the second PA decoupling circuit 64 (FIG. 11 B) provides the second notch filter. The second inductive element L2 (FIG. 11 B) has a second inductance and the second PA decoupling circuit 64 (FIG. 11 B) provides a second total capacitance, such that the second frequency response 88 is based on the second inductance and the second total capacitance.

In one embodiment of the second notch filter, the second notch frequency SNF is essentially equal to the first RF duplex frequency 42 (FIG. 12). In another embodiment of the second notch filter, the second notch frequency SNF is essentially equal to the second RF duplex frequency 80 (FIG. 12). In a further embodiment of the second notch filter, the second notch frequency SNF is essentially equal to the $N^{TH}$ RF duplex frequency 82.

Figure 14:
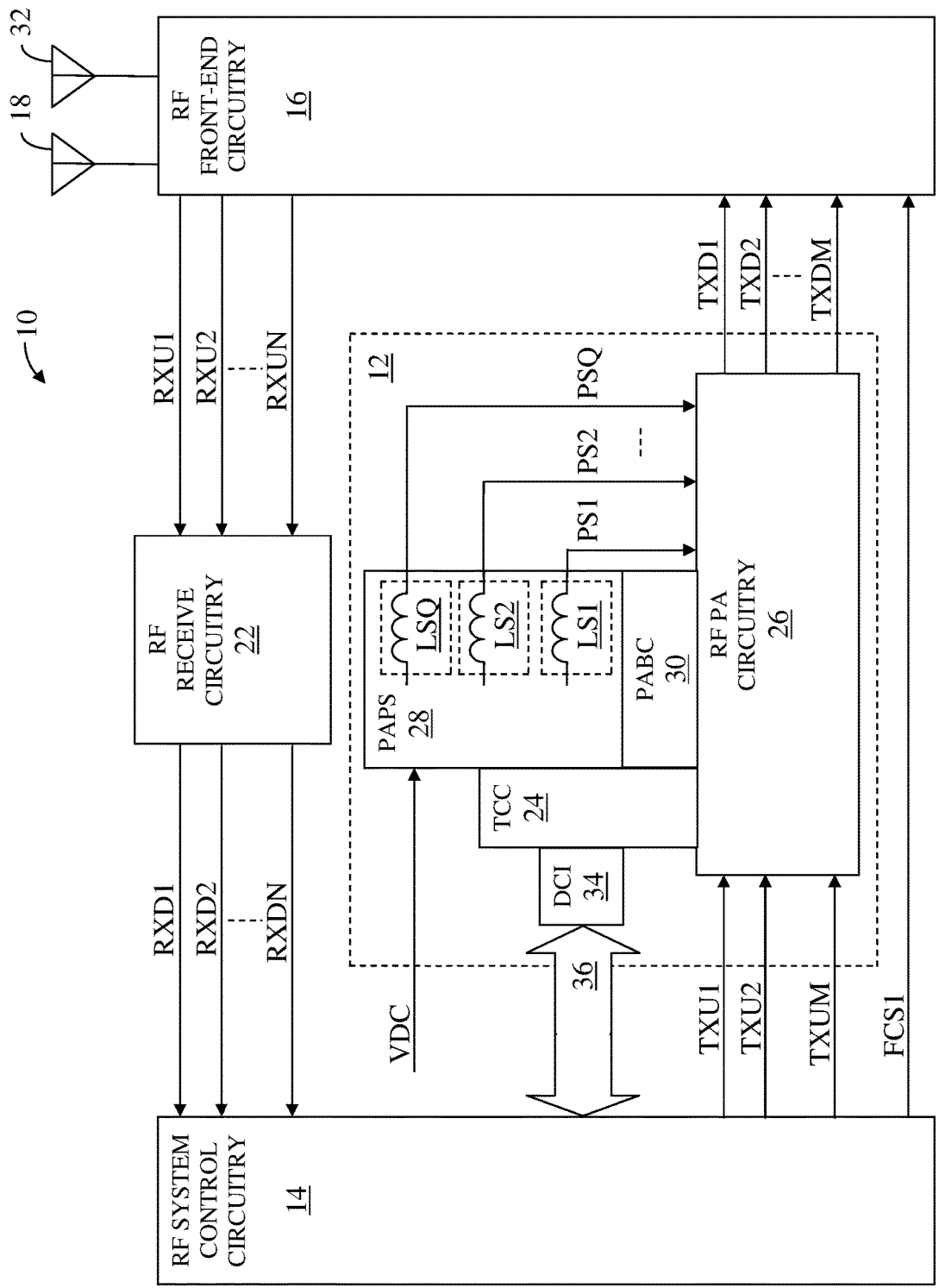
FIG. 14 shows the RF communications system according to one embodiment of the RF communications system.

FIG. 14 shows the RF communications system 10 according to one embodiment of the RF communications system 10. The RF communications system 10 illustrated in FIG. 14 is similar to the RF communications system 10 illustrated in FIG. 3, except in the RF communications system 10 illustrated in FIG. 14, the PA power supply 28 includes a first switching supply inductive element LS1, a second switching supply inductive element LS2, and up to and including a $Q^{TH}$ switching supply inductive element LSQ. As such, in one embodiment of the PA power supply 28, the PA power supply 28 provides the first PA power supply output signal PS1 to the RF PA circuitry 26 via the first switching supply inductive element LS1, a second PA power supply output signal PS2 to the RF PA circuitry 26 via the second switching supply inductive element LS2, and up to and including a $Q^{TH}$ PA power supply output signal PSQ to the RF PA circuitry 26 via the $Q^{TH}$ switching supply inductive element LSQ. By using multiple PA power supply output signals PS1, PS2, PSQ, the RF PA circuitry 26 may provide two or more of the downstream RF transmit signals TXD1, TXD2, TXDM simultaneously, such as during TXULCA.

Figure 15:
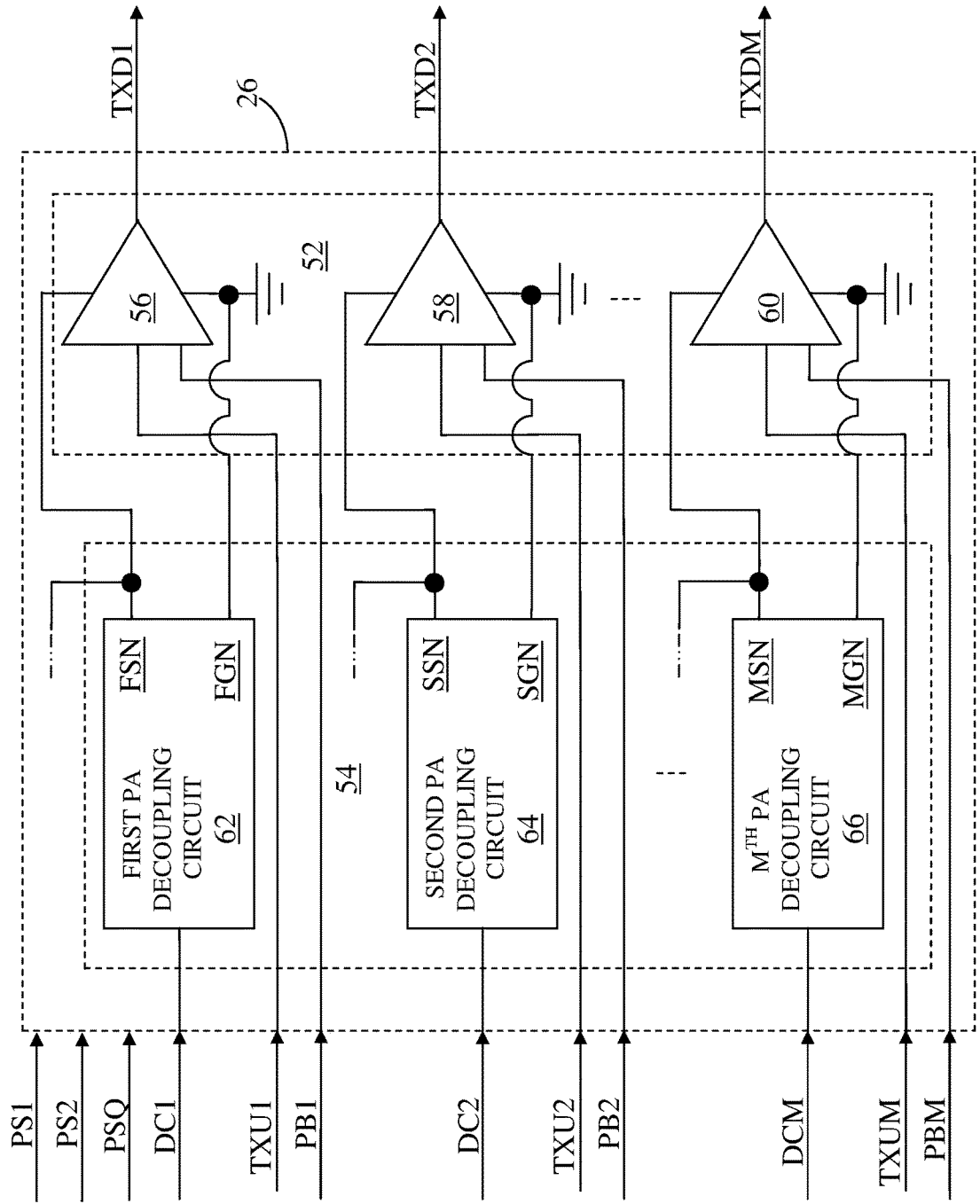
FIG. 15 shows details of the RF PA circuitry illustrated in FIG. 14 according to one embodiment of the RF PA circuitry.

FIG. 15 shows details of the RF PA circuitry 26 illustrated in FIG. 14 according to one embodiment of the RF PA circuitry 26. The RF PA circuitry 26 illustrated in FIG. 15 is similar to the RF PA circuitry 26 illustrated in FIG. 9, except in the RF PA circuitry 26 illustrated in FIG. 15, instead of each of the group 52 of RF PAs and each of the group 54 of PA decoupling circuits receiving the first PA power supply output signal PS1, as illustrated in FIG. 9, each of the group 52 of RF PAs and a corresponding one of the group 54 of PA decoupling circuits receives any of the multiple PA power supply output signals PS1, PS2, PSQ.

As such, when two or more of the group 52 of RF PAs are receiving and amplifying RF signals simultaneously, the PA power supply 28 (FIG. 14) may provide the multiple PA power supply output signals PS1, PS2, PSQ, as needed. In this regard, the PA power supply 28 (FIG. 14) may provide envelope tracking or APT to each of the group 52 of RF PAs and each of the group 54 of PA decoupling circuits, as needed. In an alternate embodiment of the PA power supply 28 (FIG. 14), the PA power supply 28 (FIG. 14) may provide groupings of the multiple PA power supply output signals PS1, PS2, PSQ to the group 52 of RF PAs and the group 54 of PA decoupling circuits.

Figure 16:
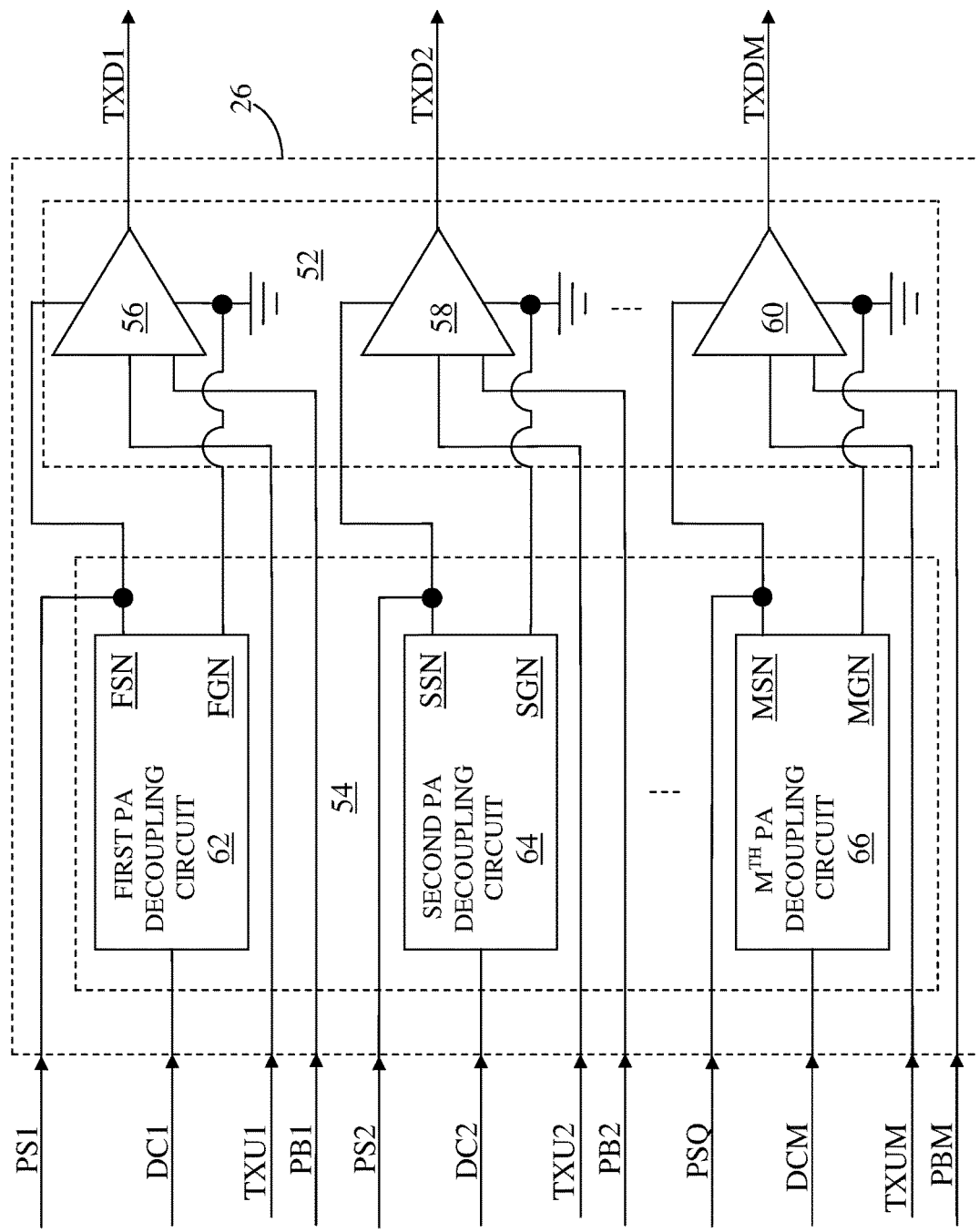
FIG. 16 shows details of the RF PA circuitry illustrated in FIG. 14 according to an alternate embodiment of the RF PA circuitry.

FIG. 16 shows details of the RF PA circuitry 26 illustrated in FIG. 14 according to an alternate embodiment of the RF PA circuitry 26. The RF PA circuitry 26 illustrated in FIG. 16 is similar to the RF PA circuitry 26 illustrated in FIG. 15, except in the RF PA circuitry 26 illustrated in FIG. 16, the PA power supply 28 (FIG. 14) provides the first PA power supply output signal PS1 to the first RF PA 56 and the first PA decoupling circuit 62. Additionally, the PA power supply 28 (FIG. 14) provides the second PA power supply output signal PS2 to the second RF PA 58 and the second PA decoupling circuit 64; and the PA power supply 28 (FIG. 14) provides the $Q^{TH}$ PA power supply output signal PSQ to the $M^{TH}$ RF PA 60 and the $M^{TH}$ PA decoupling circuit 66.

In one embodiment of the PA power supply 28 (FIG. 14), the PA power supply 28 (FIG. 14) provides envelope tracking to the first RF PA 56 and the first PA decoupling circuit 62 using the first PA power supply output signal PS1. In an alternate embodiment of the PA power supply 28 (FIG. 14), the PA power supply 28 (FIG. 14) provides APT to the first RF PA 56 and the first PA decoupling circuit 62 using the first PA power supply output signal PS1.

In one embodiment of the PA power supply 28 (FIG. 14), the PA power supply 28 (FIG. 14) provides envelope tracking to the second RF PA 58 and the second PA decoupling circuit 64 using the second PA power supply output signal PS2. In an alternate embodiment of the PA power supply 28 (FIG. 14), the PA power supply 28 (FIG. 14) provides APT to the second RF PA 58 and the second PA decoupling circuit 64 using the second PA power supply output signal PS2.

In one embodiment of the PA power supply 28 (FIG. 14), the PA power supply 28 (FIG. 14) provides envelope tracking to the $M^{TH}$ RF PA 60 and the $M^{TH}$ PA decoupling circuit 66 using the $Q^{TH}$ PA power supply output signal PSQ. In an alternate embodiment of the PA power supply 28 (FIG. 14), the PA power supply 28 (FIG. 14) provides APT to the $M^{TH}$ RF PA 60 and the $M^{TH}$ PA decoupling circuit 66 using the $Q^{TH}$ PA power supply output signal PSQ.

In one embodiment of the RF PA circuitry 26, the first RF PA 56, the second RF PA 58, and the $M^{TH}$ RF PA 60 provide the first downstream RF transmit signal TXD1, the second downstream RF transmit signal TXD2, and the $M^{TH}$ downstream RF transmit signal TXDM, respectively, simultaneously. As such, in one embodiment of the first downstream RF transmit signal TXD1, the second downstream RF transmit signal TXD2, and the $M^{TH}$ downstream RF transmit signal TXDM; the first downstream RF transmit signal TXD1, the second downstream RF transmit signal TXD2, and the $M^{TH}$ downstream RF transmit signal TXDM are TXULCA RF transmit signals. In an alternate embodiment of the RF PA circuitry 26, the $M^{TH}$ downstream RF transmit signal TXDM is omitted, such that the first downstream RF transmit signal TXD1 and the second downstream RF transmit signal TXD2 are TXULCA RF transmit signals.

Figure 17:
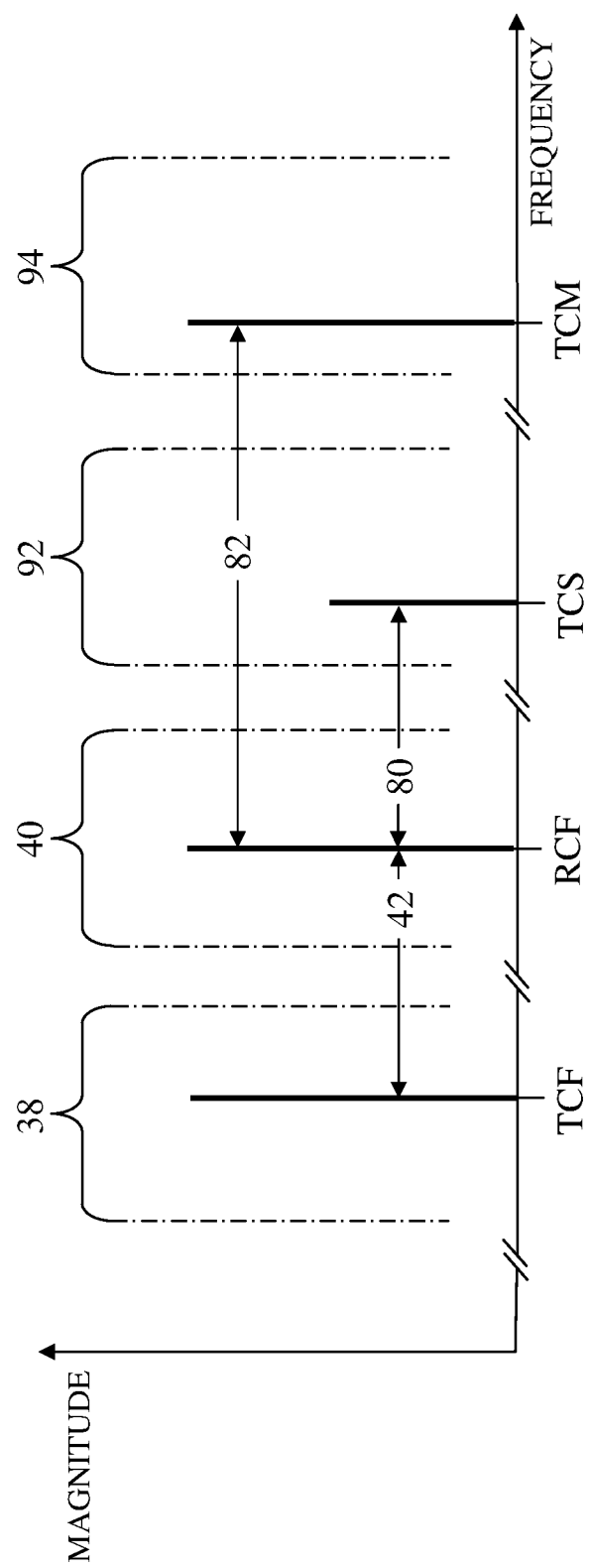
FIG. 17 is a graph illustrating the first RF transmit band, the first RF receive band, a second RF transmit band, and an $M^{TH}$ RF transmit band associated with the RF communications system illustrated in FIG. 14 according to one embodiment of the RF communications system.

FIG. 17 is a graph illustrating the first RF transmit band 38 (FIG. 4), the first RF receive band 40 (FIG. 4), a second RF transmit band 92, and an $M^{TH}$ RF transmit band 94 associated with the RF communications system 10 illustrated in FIG. 14 according to one embodiment of the RF communications system 10. As such, in one embodiment of the RF communications system 10, the RF communications system 10 is simultaneously transmitting the first downstream RF transmit signal TXD1 in the first RF transmit band 38, the second downstream RF transmit signal TXD2 in the second RF transmit band 92, and the $M^{TH}$ downstream RF transmit signal TXDM in the $M^{TH}$ RF transmit band 94. Additionally, the RF communications system 10 is receiving the first upstream RF receive signal RXU1 in the first RF receive band 40.

As such, the first downstream RF transmit signal TXD1 has the first transmit carrier frequency TCF, which is within the first RF transmit band 38; the second downstream RF transmit signal TXD2 has a second transmit carrier frequency TCS, which is within the second RF transmit band 92; and the $M^{TH}$ downstream RF transmit signal TXDM has an $M^{TH}$ transmit carrier frequency TCM, which is within the $M^{TH}$ RF transmit band 94. Additionally, the first upstream RF receive signal RXU1 has the first receive carrier frequency RCF, which is within the first RF receive band 40.

In one embodiment of the first downstream RF transmit signal TXD1, the second downstream RF transmit signal TXD2, and the $M^{TH}$ downstream RF transmit signal TXDM; the first downstream RF transmit signal TXD1, the second downstream RF transmit signal TXD2, and the $M^{TH}$ downstream RF transmit signal TXDM are TXULCA RF transmit signals. In this regard, the first RF duplex frequency 42 is based on the difference between the first transmit carrier frequency TCF and the first receive carrier frequency RCF. The second RF duplex frequency 80 is based on a difference between the second transmit carrier frequency TCS and the first receive carrier frequency RCF. An $M^{TH}$ RF duplex frequency 82 is based on a difference between the $M^{TH}$ transmit carrier frequency TCM and the first receive carrier frequency RCF.

Figure 18:
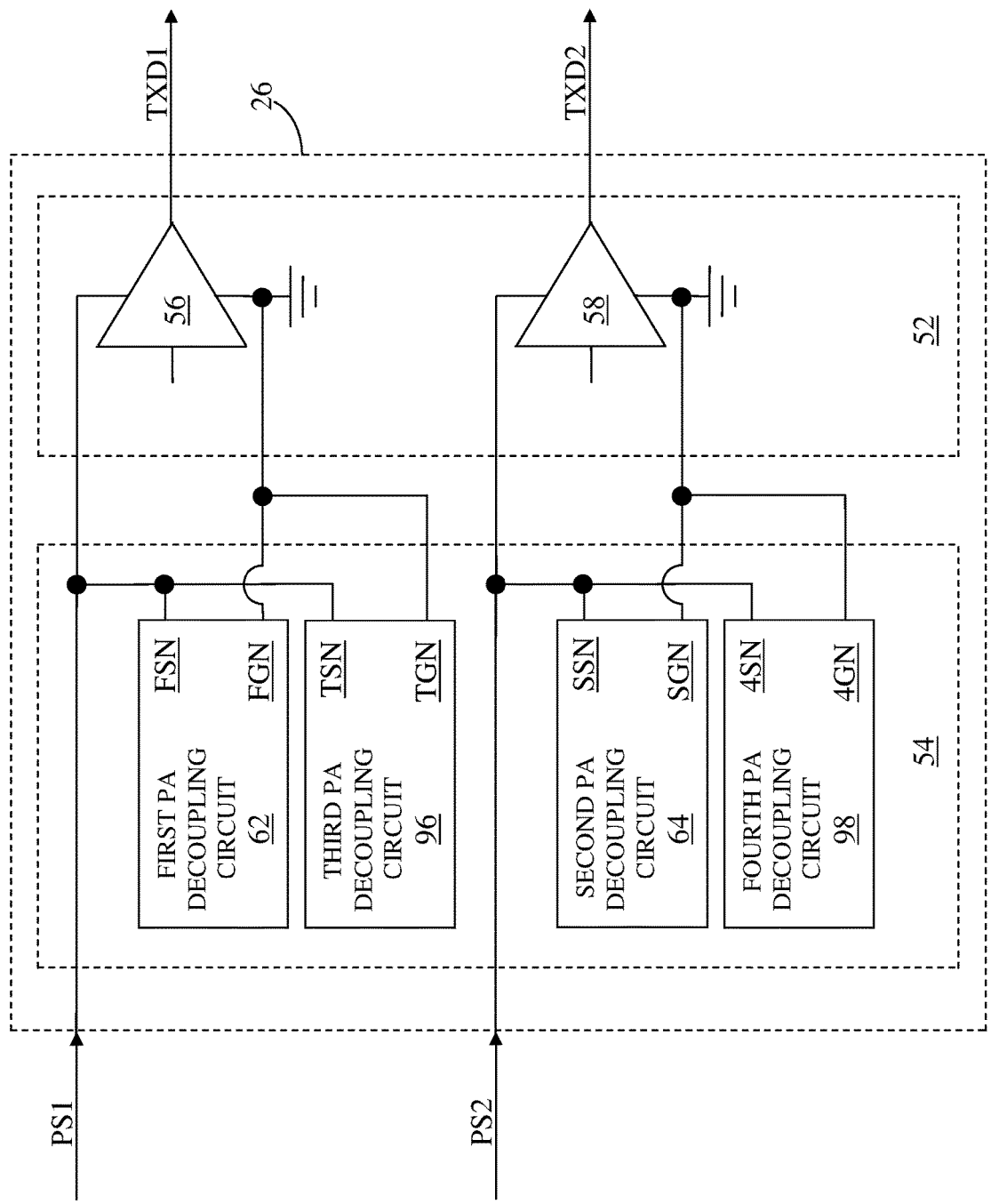
FIG. 18 shows details of the RF PA circuitry illustrated in FIG. 14 according to another embodiment of the RF PA circuitry.

FIG. 18 shows details of the RF PA circuitry 26 illustrated in FIG. 14 according to another embodiment of the RF PA circuitry 26. The RF PA circuitry 26 illustrated in FIG. 18 is similar to the RF PA circuitry 26 illustrated in FIG. 16, except in the RF PA circuitry 26 illustrated in FIG. 18, the $M^{TH}$ RF PA 60 and the $M^{TH}$ PA decoupling circuit 66 are omitted and the group 54 of PA decoupling circuits further includes a third PA decoupling circuit 96 and a fourth PA decoupling circuit 98.

The third PA decoupling circuit 96 has a third power supply connection node TSN and a third ground connection node TGN. As such, the third power supply connection node TSN and the third ground connection node TGN are coupled across the first RF PA 56. The fourth PA decoupling circuit 98 has a fourth power supply connection node 4SN and a fourth ground connection node 4GN. As such, the fourth power supply connection node 4SN and the fourth ground connection node 4GN are coupled across the second RF PA 58.

In one embodiment of the RF communications system 10 (FIG. 8), the RF communications system 10 (FIG. 8) simultaneously receives two or more RXDLCA RF receive signals while simultaneously providing two or more TXULCA RF transmit signals. As such, by coupling multiple PA decoupling circuits of the group 54 of PA decoupling circuits across each of at least some of the group 52 of RF PAs, the group 54 of PA decoupling circuits may help protect the RXDLCA RF receive signals from effects of the TXULCA RF transmit signals.

In this regard, in one embodiment of the RF communications system 10 (FIG. 8), the RF communications system 10 (FIG. 8) simultaneously receives the first upstream RF receive signal RXU1 (FIG. 8) having the first receive carrier frequency RCF and the second upstream RF receive signal RXU2 (FIG. 8) having the second receive carrier frequency RCS. Further, in one embodiment of the RF communications system 10 (FIG. 8), the RF communications system 10 (FIG. 8) simultaneously transmits the first downstream RF transmit signal TXD1 having the first transmit carrier frequency TCF and the second downstream RF transmit signal TXD2 having the second transmit carrier frequency TCS.

In one embodiment of the RF communications system 10 (FIG. 8), a first RF duplex frequency 42 (FIG. 19) is based on a difference between the first transmit carrier frequency TCF and the first receive carrier frequency RCF, a second RF duplex frequency 80 (FIG. 19) is based on a difference between the second transmit carrier frequency TCS and the first receive carrier frequency RCF, a third RF duplex frequency 102 (FIG. 19) is based on a difference between the first transmit carrier frequency TCF and the second receive carrier frequency RCS, and a fourth RF duplex frequency 106 (FIG. 19) is based on a difference between the second transmit carrier frequency TCS and the second receive carrier frequency RCS.

Figure 19:
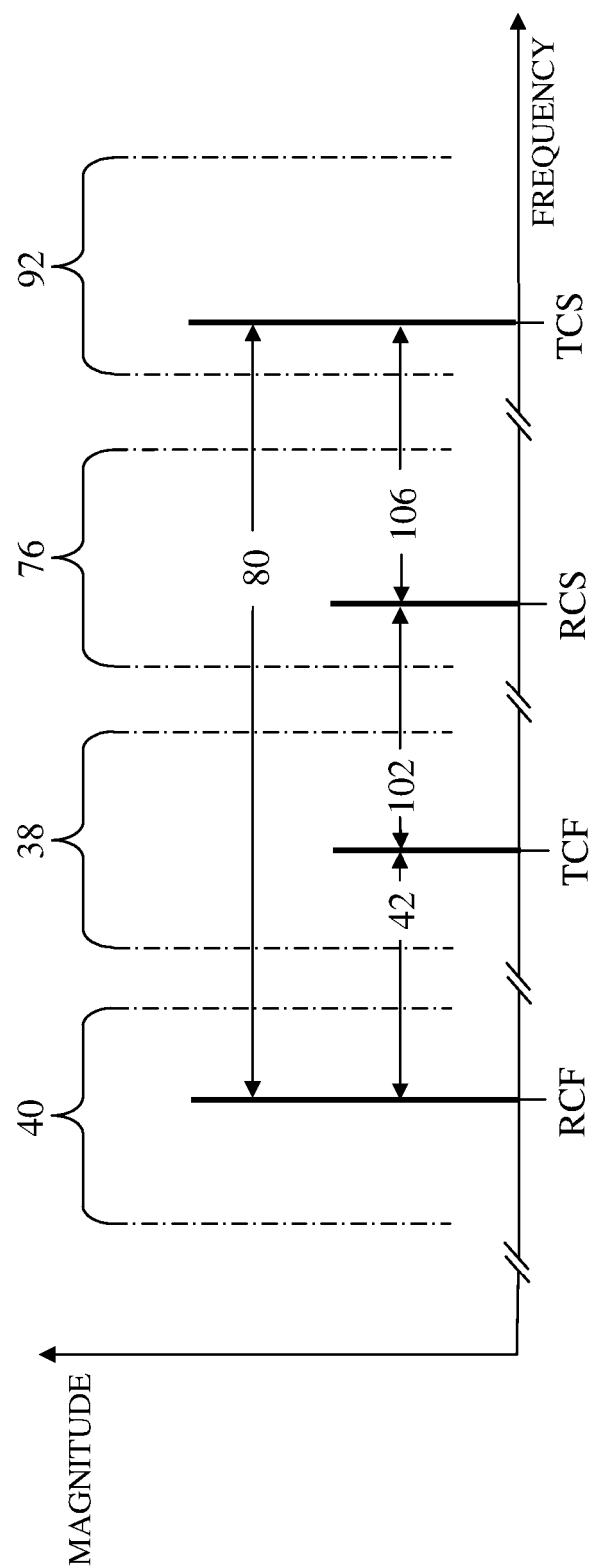
FIG. 19 is a graph illustrating a first RF transmit band, a first RF receive band, a second RF receive band, and a third RF receive band associated with the RF communications system illustrated in FIG. 14 according to one embodiment of the RF communications system.

In one embodiment of the RF communications system 10 (FIG. 8), the first PA decoupling circuit 62 provides a first notch filter having a first notch frequency, which is essentially equal to the first RF duplex frequency 42 (FIG. 19), the second PA decoupling circuit 64 provides a second notch filter having a second notch frequency, which is essentially equal to the second RF duplex frequency 80 (FIG. 19), the third PA decoupling circuit 96 provides a third notch filter having a third notch frequency, which is essentially equal to the third RF duplex frequency 102 (FIG. 19), and the fourth PA decoupling circuit 98 provides a fourth notch filter having a fourth notch frequency, which is essentially equal to the fourth RF duplex frequency 106 (FIG. 19). In general, in an alternate embodiment of the RF communications system 10 (FIG. 8), one, more, or none of the group 54 of PA decoupling circuits is associated with a corresponding each of the group 52 of RF PAs.

FIG. 19 is a graph illustrating the first RF transmit band 38 (FIG. 12), the first RF receive band 40 (FIG. 12), the second RF receive band 76 (FIG. 12), and the second RF transmit band 92 (FIG. 17) associated with the RF communications system 10 illustrated in FIG. 14 according to one embodiment of the RF communications system 10. As such, in one embodiment of the RF communications system 10, the RF communications system 10 is simultaneously transmitting the first downstream RF transmit signal TXD1 in the first RF transmit band 38 and the second downstream RF transmit signal TXD2 in the second RF transmit band 92; and simultaneously receiving the first upstream RF receive signal RXU1 in the first RF receive band 40 and the second upstream RF receive signal RXU2 in the second RF receive band 76.

As such, the first downstream RF transmit signal TXD1 has the first transmit carrier frequency TCF, which is within the first RF transmit band 38; the second downstream RF transmit signal TXD2 has the second transmit carrier frequency TCS, which is within the second RF transmit band 92; the first upstream RF receive signal RXU1 has the first receive carrier frequency RCF, which is within the first RF receive band 40; and the second upstream RF receive signal RXU2 has the second receive carrier frequency RCS, which is within the second RF receive band 76.

In this regard, in one embodiment of the RF communications system 10, the first RF duplex frequency 42 is based on the difference between the first transmit carrier frequency TCF and the first receive carrier frequency RCF; the second RF duplex frequency 80 is based on the difference between the second transmit carrier frequency TCS and the first receive carrier frequency RCF; the third RF duplex frequency 102 is based on the difference between the first transmit carrier frequency TCF and the second receive carrier frequency RCS; and the fourth RF duplex frequency 106 is based on the difference between the second transmit carrier frequency TCS and the second receive carrier frequency RCS.

Figure 20:
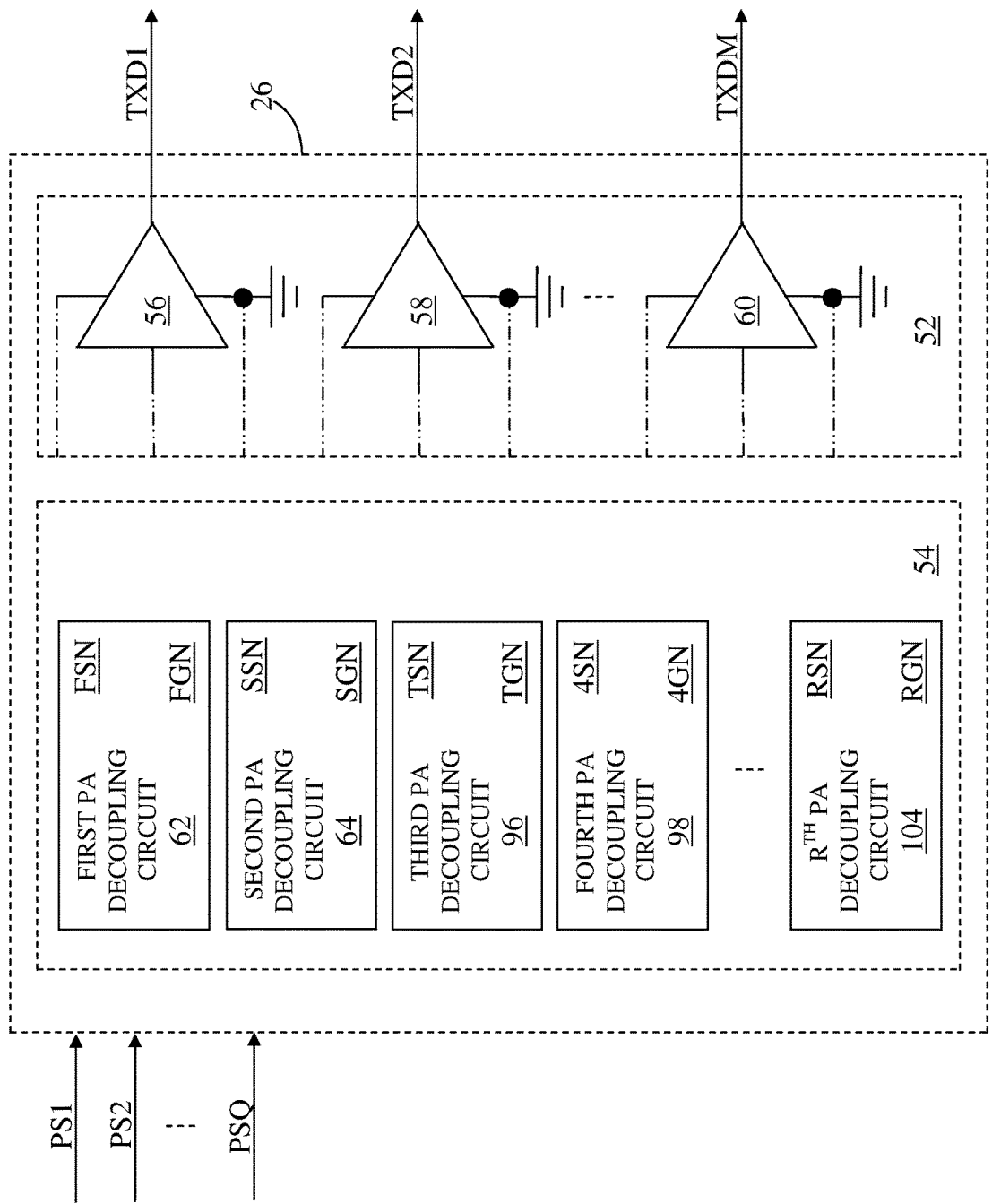
FIG. 20 shows details of the RF PA circuitry illustrated in FIG. 14 according to an additional embodiment of the RF PA circuitry.

FIG. 20 shows details of the RF PA circuitry 26 illustrated in FIG. 14 according to an additional embodiment of the RF PA circuitry 26. The RF PA circuitry 26 illustrated in FIG. 20 is similar to the RF PA circuitry 26 illustrated in FIG. 16, except in the RF PA circuitry 26 illustrated in FIG. 20, signals that are internal to the RF PA circuitry 26 are not shown to simplify FIG. 20. Additionally, the group 54 of PA decoupling circuits further includes the third PA decoupling circuit 96, the fourth PA decoupling circuit 98, and up to and including an $R^{TH}$ PA decoupling circuit 104.

The $R^{TH}$ PA decoupling circuit 104 has an $R^{TH}$ power supply connection node RSN and an $R^{TH}$ ground connection node RGN. In an alternate embodiment of the group 54 of PA decoupling circuits, the $R^{TH}$ PA decoupling circuit 104 is omitted. In one embodiment of the group 54 of PA decoupling circuits, the group 54 of PA decoupling circuits does not have a one-to-one correlation to the group 52 of RF PAs. In one embodiment of the group 54 of PA decoupling circuits, the group 54 of PA decoupling circuits is used as needed to provide filtering of any or all of the PA power supply output signals PS1, PS2, PSQ.

In one embodiment of the RF front-end circuitry 16 (FIG. 1), the RF front-end circuitry 16 (FIG. 1) receives the group of upstream RF receive signals RXU1, RXU2, RXUN (FIG. 1). In one embodiment of the group 54 of PA decoupling circuits, the group 54 of PA decoupling circuits provides a corresponding group of notch filters. In one embodiment of the group of notch filters, the group of notch filters has a corresponding group of notch frequencies. In one embodiment of the group of notch filters, each of the group of notch frequencies is essentially equal to a corresponding one of a group of RF duplex frequencies. In one embodiment of the group 52 of RF PAs, the group 52 of RF PAs provides a corresponding group of downstream RF transmit signals TXD1, TXD2, TXDM. In one embodiment of the group of upstream RF receive signals RXU1, RXU2, RXUN (FIG. 1), each of the group of upstream RF receive signals RXU1, RXU2, RXUN (FIG. 1) has a corresponding one of a group of receive carrier frequencies. In one embodiment of the group of downstream RF transmit signals TXD1, TXD2, TXDM, each of the group of downstream RF transmit signals TXD1, TXD2, TXDM has a corresponding one of a group of transmit carrier frequencies.

In one embodiment of the group of RF duplex frequencies, each of the group of RF duplex frequencies is essentially equal to a difference between a corresponding one of the group of transmit carrier frequencies and a corresponding one of the group of receive carrier frequencies. In one embodiment of the group of upstream RF receive signals RXU1, RXU2, RXUN (FIG. 1) and the group of downstream RF transmit signals TXD1, TXD2, TXDM, at least one of the group of upstream RF receive signals RXU1, RXU2, RXUN (FIG. 1) is a time division duplex (TDD) RF receive signal and at least one of the group of downstream RF transmit signals TXD1, TXD2, TXDM is a TDD RF transmit signal. In one embodiment of the group of upstream RF receive signals RXU1, RXU2, RXUN (FIG. 1) and the group of downstream RF transmit signals TXD1, TXD2, TXDM, at least one of the group of upstream RF receive signals RXU1, RXU2, RXUN (FIG. 1) is a frequency division duplex (FDD) RF receive signal and at least one of the group of downstream RF transmit signals TXD1, TXD2, TXDM is an FDD RF transmit signal.

In one embodiment of the group of upstream RF receive signals RXU1, RXU2, RXUN (FIG. 1), at least two of the group of upstream RF receive signals RXU1, RXU2, RXUN (FIG. 1) are RXDLCA RF receive signals. In one embodiment of the group of downstream RF transmit signals TXD1, TXD2, TXDM, at least two of the group of downstream RF transmit signals TXD1, TXD2, TXDM are TXULCA RF transmit signals.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
a power amplifier (PA) power supply configured to provide a first PA power supply output signal to a plurality of radio frequency (RF) PAs and to a plurality of PA decoupling circuits; and
RF PA circuitry comprising:
the plurality of RF PAs comprising a first RF PA and a second RF PA, such that each of the plurality of RF PAs is configured to receive and amplify a corresponding RF signal and is coupled between the PA power supply and a ground; and
the plurality of PA decoupling circuits comprising a first PA decoupling circuit coupled across the first RF PA between the PA power supply and the ground and a second PA decoupling circuit coupled across the second RF PA between the PA power supply and the ground;

wherein:
the first PA decoupling circuit is programmable and configured to:
at least partially decouple the first RF PA from other circuitry by providing a first capacitance across the first RF PA when in an enabled state; and
operate in a disabled state in response to the first RF PA being disabled, such that during the disabled state the first capacitance is reduced; and
the second PA decoupling circuit is programmable and configured to:
at least partially decouple the second RF PA from other circuitry by providing a second capacitance across the second RF PA when in an enabled state; and
operate in a disabled state in response to the second RF PA being disabled, such that during the disabled state the second capacitance is reduced.

2. The circuitry of claim 1 wherein each of the plurality of PA decoupling circuits is in proximity to a corresponding one of the plurality of RF PAs, each of the plurality of PA decoupling circuits is coupled across a corresponding one of the plurality of RF PAs between the PA power supply and the ground, and each of the plurality of PA decoupling circuits is configured to at least partially decouple a corresponding one of the plurality of RF PAs from other circuitry.

3. The circuitry of claim 1 wherein at least one of the plurality of PA decoupling circuits is configured to be not programmable.

4. The circuitry of claim 1 wherein the first PA decoupling circuit is further configured to operate in an enabled state in response to the first RF PA being enabled; and during the enabled state, provide a notch filter having a notch frequency, which is based on the first capacitance and an inductance of the first PA decoupling circuit.

5. The circuitry of claim 4 wherein the notch frequency is substantially equal to an RF duplex frequency.

6. The circuitry of claim 1 wherein the first PA decoupling circuit is further configured to operate in an enabled state; such that during the enabled state, the first PA decoupling circuit is further configured to present the first capacitance across the PA power supply.

7. The circuitry of claim 6 wherein:
the first PA decoupling circuit comprises a plurality of parallel switched capacitors; and
during the disabled state, the first PA decoupling circuit is further configured to switch off each of the plurality of parallel switched capacitors to present a third capacitance across the PA power supply that is substantially equal to zero.

8. The circuitry of claim 1 configured to simultaneously receive a first upstream RF receive signal having a first receive carrier frequency and a second upstream RF receive signal having a second receive carrier frequency, wherein:
the first RF PA is configured to receive and amplify a first upstream RF transmit signal to provide a first downstream RF transmit signal having a transmit carrier frequency;
a first RF duplex frequency is based on a difference between the transmit carrier frequency and the first receive carrier frequency;
a second RF duplex frequency is based on a difference between the transmit carrier frequency and the second receive carrier frequency;
the first PA decoupling circuit is configured to provide a first notch filter having a first notch frequency, which is essentially equal to the first RF duplex frequency; and
the second PA decoupling circuit is configured to provide a second notch filter having a second notch frequency, which is essentially equal to the second RF duplex frequency.

9. The circuitry of claim 8 wherein the first upstream RF receive signal and the second upstream RF receive signal are receive downlink carrier aggregation RF receive signals.

10. The circuitry of claim 1 wherein:
the first RF PA is configured to receive and amplify a first upstream RF transmit signal to provide a first downstream RF transmit signal; and
the second RF PA is configured to receive and amplify a second upstream RF transmit signal to provide a second downstream RF transmit signal.

11. The circuitry of claim 10 wherein the first RF PA and the second RF PA are further configured to provide the first downstream RF transmit signal and the second downstream RF transmit signal simultaneously, such that the first downstream RF transmit signal and the second downstream RF transmit signal are transmit uplink carrier aggregation RF transmit signals.

12. The circuitry of claim 10 configured to receive a first upstream RF receive signal having a first receive carrier frequency, wherein:
the first downstream RF transmit signal has a first transmit carrier frequency;
the second downstream RF transmit signal has a second transmit carrier frequency;
a first RF duplex frequency is based on a difference between the first transmit carrier frequency and the first receive carrier frequency;
a second RF duplex frequency is based on a difference between the second transmit carrier frequency and the first receive carrier frequency;
the first PA decoupling circuit is configured to provide a first notch filter having a first notch frequency, which is essentially equal to the first RF duplex frequency; and
the second PA decoupling circuit is configured to provide a second notch filter having a second notch frequency, which is essentially equal to the second RF duplex frequency.

13. The circuitry of claim 10 configured to receive a first upstream RF receive signal having a first receive carrier frequency and a second upstream RF receive signal having a second receive carrier frequency, wherein:
the plurality of PA decoupling circuits further comprises a third PA decoupling circuit coupled across the first RF PA between the PA power supply and the ground and a fourth PA decoupling circuit coupled across the second RF PA between the PA power supply and the ground;
the first downstream RF transmit signal has a first transmit carrier frequency;
the second downstream RF transmit signal has a second transmit carrier frequency;
a first RF duplex frequency is based on a difference between the first transmit carrier frequency and the first receive carrier frequency;
a second RF duplex frequency is based on a difference between the second transmit carrier frequency and the first receive carrier frequency;
a third RF duplex frequency is based on a difference between the first transmit carrier frequency and the second receive carrier frequency;
a fourth RF duplex frequency is based on a difference between the second transmit carrier frequency and the second receive carrier frequency;

the first PA decoupling circuit is configured to provide a first notch filter having a first notch frequency, which is essentially equal to the first RF duplex frequency;

the second PA decoupling circuit is configured to provide a second notch filter having a second notch frequency, which is essentially equal to the second RF duplex frequency;

the third PA decoupling circuit is configured to provide a third notch filter having a third notch frequency, which is essentially equal to the third RF duplex frequency; and the fourth PA decoupling circuit is configured to provide a fourth notch filter having a fourth notch frequency, which is essentially equal to the fourth RF duplex frequency.

14. The circuitry of claim 10 wherein the PA power supply is further configured to:

provide the first PA power supply output signal to the first RF PA and the first PA decoupling circuit; and provide a second PA power supply output signal to the second RF PA and the second PA decoupling circuit.

15. The circuitry of claim 1 configured to receive a plurality of upstream RF receive signals, wherein:

the plurality of PA decoupling circuits is configured to provide a corresponding plurality of notch filters;

the plurality of notch filters has a corresponding plurality of notch frequencies;

each of the plurality of notch frequencies is essentially equal to a corresponding one of a plurality of RF duplex frequencies;

the plurality of RF PAs is configured to provide a corresponding plurality of downstream RF transmit signals;

each of the plurality of upstream RF receive signals has a corresponding one of a plurality of receive carrier frequencies;

each of the plurality of downstream RF transmit signals has a corresponding one of a plurality of transmit carrier frequencies; and each of the plurality of RF duplex frequencies is essentially equal to a difference between a corresponding one of the plurality of transmit carrier frequencies and a corresponding one of the plurality of receive carrier frequencies.

16. The circuitry of claim 15 wherein at least one of the plurality of upstream RF receive signals is a time division duplex (TDD) RF receive signal and at least one of the plurality of downstream RF transmit signals is a TDD RF transmit signal.

17. The circuitry of claim 1 wherein:

the first PA decoupling circuit is further configured to operate in an enabled state when the first RF PA is enabled, such that during the enabled state, the first PA decoupling circuit is further configured to provide the first capacitance and a first inductance;

the second PA decoupling circuit is further configured to operate in an enabled state when the second RF PA is enabled, such that during the enabled state, the second PA decoupling circuit is further configured to provide the second capacitance and a second inductance; and a frequency response of a first notch filter having a first notch frequency is based on the first capacitance and the first inductance; and a frequency response of a second notch filter having a second notch frequency is based on the second capacitance and the second inductance.

18. The circuitry of claim 1 wherein the first PA power supply output signal is configured to provide envelope tracking to at least the first RF PA.

19. The circuitry of claim 1 wherein the first PA power supply output signal is configured to provide average power tracking to at least the first RF PA.

20. The circuitry of claim 1 wherein the PA power supply is further configured to provide the first PA power supply output signal to the first RF PA via the first PA decoupling circuit.

* * * * *